(12) United States Patent
Wigglesworth et al.

(10) Patent No.: US 9,761,803 B2
(45) Date of Patent: Sep. 12, 2017

(54) SEMICONDUCTOR COMPOSITION

(71) Applicant: Xerox Corporation, Norwalk, CT (US)

(72) Inventors: Anthony James Wigglesworth, Oakville (CA); Yiliang Wu, Oakville (CA); Matthew A. Heuft, Oakville (CA)

(73) Assignee: XEROX CORPORATION, Norwalk, CT (US)

( * ) Notice: Subject to any disclaimer, the term of this patent is extended or adjusted under 35 U.S.C. 154(b) by 733 days.

(21) Appl. No.: 13/947,248

(22) Filed: Jul. 22, 2013

(65) Prior Publication Data

US 2015/0021526 A1 Jan. 22, 2015

(51) Int. Cl.
| | |
|---|---|
| H01L 51/00 | (2006.01) |
| C08G 73/00 | (2006.01) |
| C08G 61/12 | (2006.01) |
| C08L 65/00 | (2006.01) |
| H01L 51/05 | (2006.01) |

(52) U.S. Cl.
CPC ........ *H01L 51/0036* (2013.01); *C08G 61/124* (2013.01); *C08G 61/126* (2013.01); *C08L 65/00* (2013.01); *H01L 51/0007* (2013.01); *H01L 51/0043* (2013.01); *C08G 2261/1412* (2013.01); *C08G 2261/3223* (2013.01); *C08G 2261/3243* (2013.01); *C08G 2261/344* (2013.01); *C08G 2261/364* (2013.01); *C08G 2261/411* (2013.01); *C08G 2261/414* (2013.01); *C08G 2261/92* (2013.01); *C08G 2261/95* (2013.01); *H01L 51/0053* (2013.01); *H01L 51/0541* (2013.01); *H01L 51/0545* (2013.01)

(58) Field of Classification Search
None
See application file for complete search history.

(56) References Cited

U.S. PATENT DOCUMENTS

| | | | |
|---|---|---|---|
| 6,451,459 B1* | 9/2002 | Tieke | C09K 11/06 252/301.35 |
| 7,910,684 B2 | 3/2011 | Li | |
| 7,932,344 B2 | 4/2011 | Li | |
| 2007/0228359 A1* | 10/2007 | Heim | C08G 61/123 257/40 |
| 2009/0302311 A1 | 12/2009 | Turbiez et al. | |
| 2011/0240981 A1* | 10/2011 | Duggeli | C08G 61/12 257/40 |

(Continued)

OTHER PUBLICATIONS

Pohanish, Richard P., (2012). "Xylenes", Sittig's Handbook of Toxic and Hazardous Chemicals and Carcinogens (6th Edition). Elsevier, pp. 2726-2729. Online version available at: http://app.knovel.com/hotlink/toc/id:kpSHTHCC12/sittigs-handbook-toxic-3/sittigs-handbook-toxic-3.*

*Primary Examiner* — Katie L Hammer
(74) *Attorney, Agent, or Firm* — Fay Sharpe LLP

(57) ABSTRACT

A semiconductor composition for producing a semiconducting layer with consistently high mobility is disclosed. The semiconductor composition includes a diketopyrrolopyrrole-thiophene copolymer and an aromatic non-halogenated hydrocarbon solvent. The copolymer has a structure disclosed within. The aromatic non-halogenated aromatic hydrocarbon solvent contains sidechains having at least 2 carbon atoms and the aromatic ring contains at least 3 hydrogen atoms.

11 Claims, 7 Drawing Sheets

(56) References Cited

U.S. PATENT DOCUMENTS

2011/0284826 A1* 11/2011 Hayoz .................... B82Y 10/00
  257/40
2012/0059140 A1*  3/2012 Hayoz .................. C07D 487/04
  528/8
2012/0153274 A1   6/2012 Sonar et al.
2014/0299871 A1* 10/2014 Bujard .................. C08G 61/12
  257/40

* cited by examiner

SEMICONDUCTOR COMPOSITION

BACKGROUND

The present disclosure relates to thin-film transistors (TFTs) and/or other electronic devices comprising a semiconducting layer. The semiconducting layer is formed from a semiconductor composition as described herein. When the composition is used in the semiconducting layer of a device, high mobility and excellent stability may be achieved.

TFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio of the overall transistor. High mobility and high on/off ratio are desired.

Organic thin-film transistors (OTFTs) can be used in applications such as radio frequency identification (RFID) tags and backplane switching circuits for displays, such as signage, readers, and liquid crystal displays, where high switching speeds and/or high density are not essential. They also have attractive mechanical properties such as being physically compact, lightweight, and flexible.

Organic thin-film transistors can be fabricated using low-cost solution-based patterning and deposition techniques, such as spin coating, solution casting, dip coating, stencil/screen printing, flexography, gravure, offset printing, ink jet-printing, micro-contact printing, and the like. To enable the use of these solution-based processes in fabricating thin-film transistor circuits, solution processable materials are therefore required. However, most current organic or polymeric semiconductors formed by solution processing tend to suffer from limited solubility, air sensitivity, and especially low field-effect mobility. Some poor performance, such as low field-effect mobility, may be attributable to the poor semiconductor film formed from an improper semiconductor composition.

It would be desirable to develop semiconductor compositions that can be used to form semiconducting layers that exhibit high field effect mobility, air stability, and good solubility.

BRIEF DESCRIPTION

The present application discloses, in various embodiments, semiconductor compositions that can be used to form semiconducting layers that have high mobility. The semiconductor compositions comprise an aromatic non-halogenated hydrocarbon solvent and a donor-acceptor type of semiconducting polymer as described herein. Desirably, the aromatic non-halogenated hydrocarbon solvent contains one or more sidechains that contain a total of at least 2 carbon atoms, and the aromatic ring contains at least 3 hydrogen atoms. In some particular embodiments, the semiconducting copolymer is a copolymer comprising an optionally substituted diketopyrrolopyrrole moiety and an optionally substituted thiophene moiety.

Disclosed in some embodiments is a composition comprising: an aromatic non-halogenated hydrocarbon solvent that has one or more sidechains, the one or more sidechains in combination containing at least 2 carbon atoms, and the aromatic ring having at least 3 hydrogen atoms; and a polymer of Formula (I):

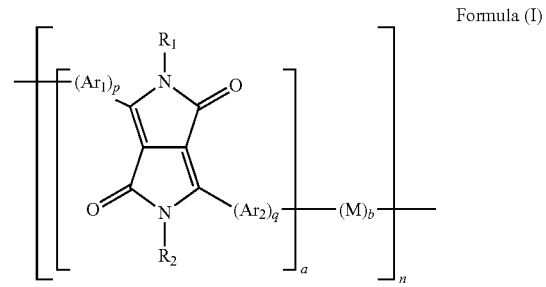

wherein $R_1$ and $R_2$ are independently hydrogen, oligo(alkylene glycol), alkyl, substituted alkyl, aryl, substituted aryl, heteroaryl, or substituted heteroaryl; a is at least 1; p and q are each an integer of 0 or greater; the sum of (p+q) is at least 2; M is a conjugated moiety; b is from 0 to about 5; n is from 2 to about 50; and each $Ar_1$ and $Ar_2$ unit is independently selected from the group consisting of:

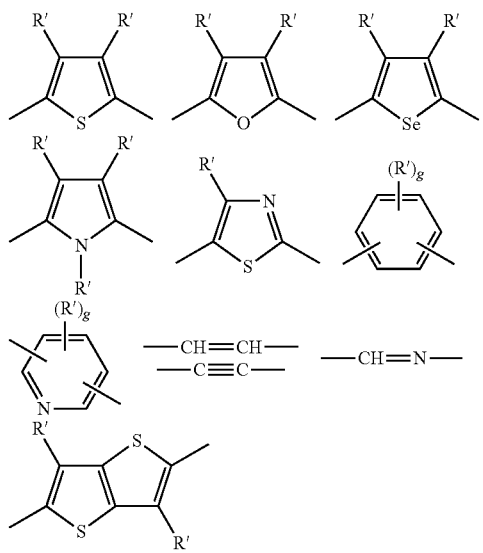

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —$NO_2$; and g is from 0 to 5.

In particular embodiments, the aromatic non-halogenated hydrocarbon solvent contains only one phenyl ring, having six possible substituents, of which at least 3 are hydrogen atoms, and the substituents having at least 2 carbon atoms. Desirably, a substituent is an alkyl chain. The aromatic non-halogenated hydrocarbon solvent may be selected from the group consisting of p-xylene, o-xylene, m-xylene, ethyl benzene, 1,3,5-trimethylbenzene, tetrahydronaphthalene, and xylenes. Desirably, the aromatic non-halogenated hydrocarbon solvent is p-xylene.

The aromatic non-halogenated hydrocarbon solvent may have a Hildebrand solubility parameter (δ) of at least 17 $MPa^{1/2}$, and a Hildebrand solubility parameter of at most 20 $MPa^{1/2}$.

The polymer has good solubility in the selected solvent. The polymer may be at least 0.3 wt % of the composition, including from about 0.3 wt % to about 4 wt % of the semiconductor composition. The polymer can have a weight average molecular weight of about 20,000 to about 80,000.

In embodiments of Formula (I), $R_1$ and $R_2$ are alkyl. Sometimes, b is 0. Other times, the sum of (p+q) is at least 2, or is from 2 to 6. In more particular embodiments, n is from about 10 to about 30, and the polymer has a weight average molecular weight of about 20,000 to about 60,000.

In particular embodiments, the polymer has the structure of Formula (II):

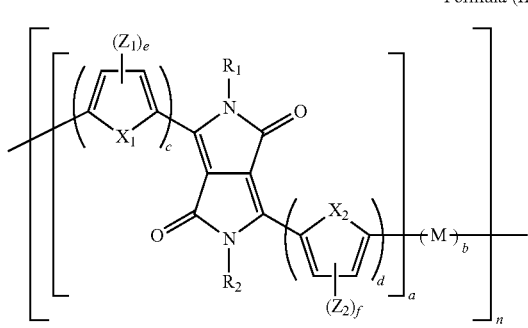

Formula (II)

wherein $R_1$ and $R_2$ are independently hydrogen, oligo(alkylene glycol), alkyl, substituted alkyl, aryl, substituted aryl, heteroaryl, or substituted heteroaryl;

each $X_1$ and $X_2$ is independently S, Se, O, or NR", wherein each R" can independently be hydrogen, aryl, or alkyl;

each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —NO$_2$;

M is a conjugated moiety; a is at least 1; b is from 0 to about 5; c and d are each an integer of 0 or greater, and the sum of (c+d) is at least 2; e and f are independently from 0 to 2; and n is from 2 to about 50.

In other embodiments, the polymer has the structure of Formula (III):

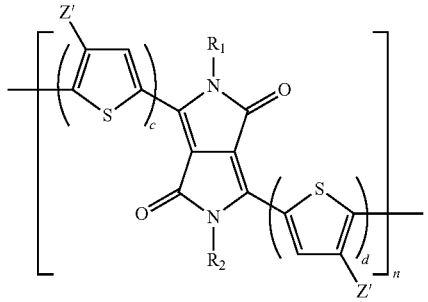

Formula (III)

wherein $R_1$ and $R_2$ are independently hydrogen, oligo(alkylene glycol), alkyl, substituted alkyl, aryl, substituted aryl, heteroaryl, or substituted heteroaryl;

each Z' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1, 2, 3, or 4.

In still other embodiments, the polymer has the structure of Formula (IV):

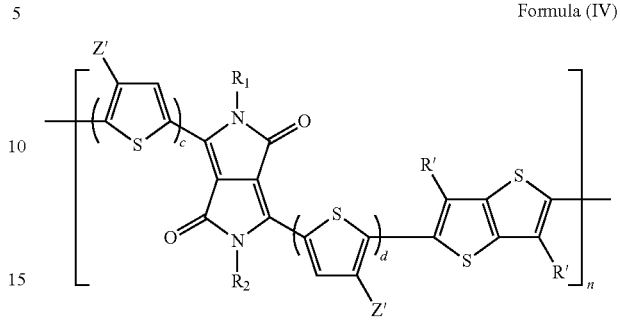

Formula (IV)

wherein $R_1$ and $R_2$ are independently hydrogen, oligo(alkylene glycol), alkyl, substituted alkyl, aryl, substituted aryl, heteroaryl, or substituted heteroaryl;

each Z' and R' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1 or 2.

More specifically, the polymer may have the structure of one of Formulas (1) through (30), as discussed more thoroughly within.

In some cases, the average mobility of a semiconducting layer formed from the semiconductor composition may be at least 30% greater than the average mobility of a semiconducting layer formed from a semiconductor composition containing the same polymer and a halogenated organic solvent, or more than 50% greater, or more than 100% greater than the average mobility of a semiconducting layer formed from a semiconductor composition containing the same polymer and a halogenated organic solvent, when processed under the same conditions. Such results were unexpected from the selection of the solvent.

In some embodiments, the average mobility of a semiconducting layer formed from the semiconductor composition is at least 0.5 cm$^2$/V·sec, or is at least 0.6 cm$^2$/V·sec, or is at least 0.8 cm$^2$/V·sec.

In yet other embodiments, the polymer has the structure of Formula (V):

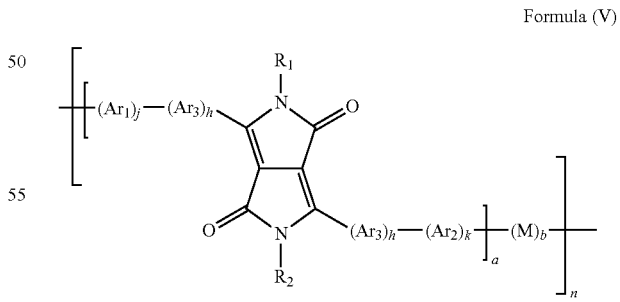

Formula (V)

wherein $R_1$ and $R_2$ are independently hydrogen, oligo(alkylene glycol), alkyl, substituted alkyl, aryl, substituted aryl, heteroaryl, or substituted heteroaryl;

a is at least 1; h is 0 or 1; j and k are each an integer of 0 or greater; the sum of (2h+j+k) is at least 2; b is from 0 to about 5; n is from 2 to about 50; each $Ar_1$ and $Ar_2$ unit is independently selected from the group consisting of:

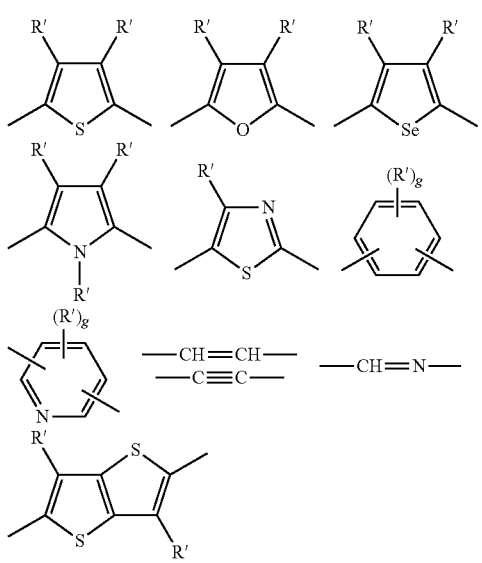

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO₂; and g is from 0 to 5; and M is a conjugated moiety independently selected from the group consisting of:

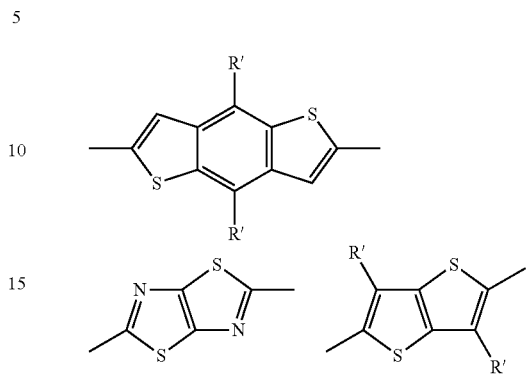

Also disclosed in embodiments is a semiconductor composition comprising: an aromatic non-halogenated hydrocarbon solvent selected from the group consisting of p-xylene, o-xylene, m-xylene, and tetrahydronaphthalene; and a polymer selected from the group consisting of Formula (1-A), (17), (18), (19), (20), (20-A), and (20-B):

Formula (1-A)

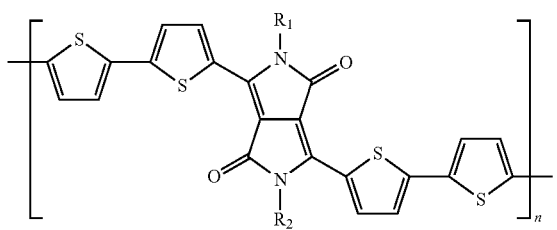

Formula (17)

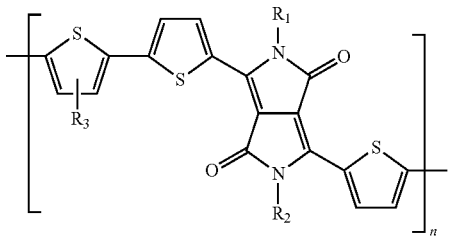

Formula (18)

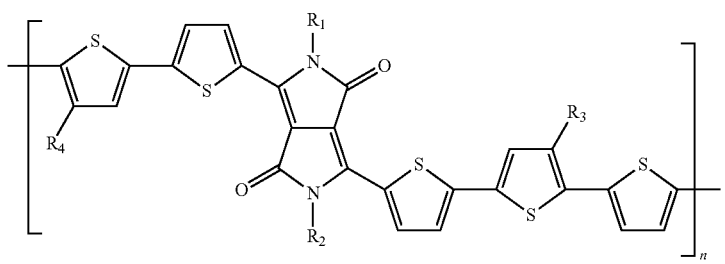

Formula (19)

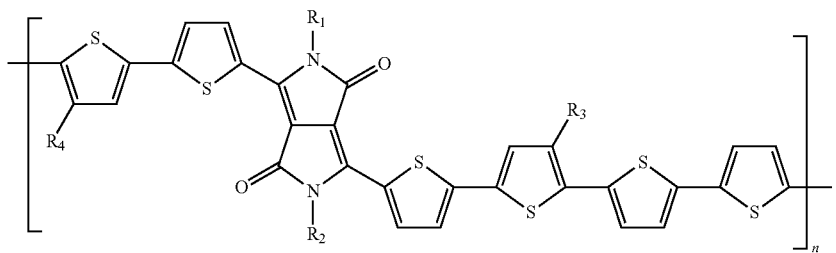

-continued

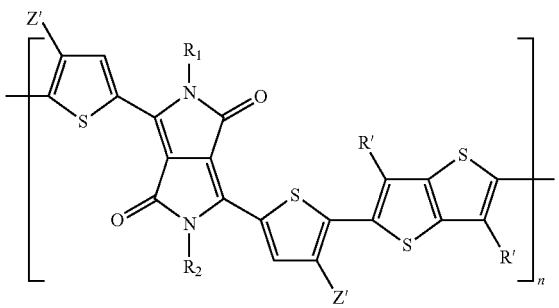
Formula (20)

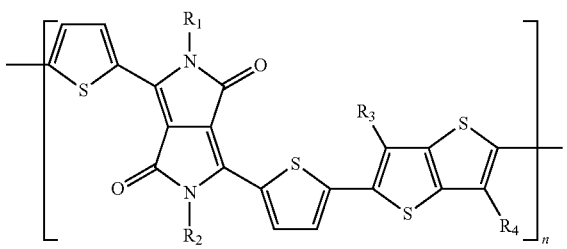
Formula (20-A)

Formula (20-B)

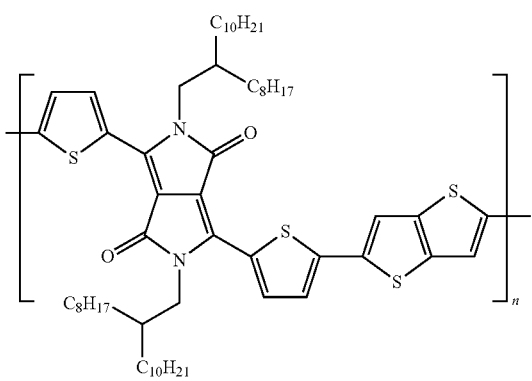

wherein $R_1$ and $R_2$ are independently hydrogen, oligo(alkylene glycol), alkyl, substituted alkyl, aryl, substituted aryl, heteroaryl, or substituted heteroaryl;

n is from 2 to about 50; and $R_3$, $R_4$, $R_5$, and $R_6$ are independently hydrogen, alkyl, substituted alkyl, aryl, substituted aryl, heteroaryl, substituted heteroaryl, halogen, alkoxy, alkylthio, trialkylsilyl, —CN, or —NO$_2$.

Still disclosed in other various embodiments is an electronic device comprising a semiconducting layer, wherein the semiconducting layer is formed from a semiconductor composition comprising: an aromatic non-halogenated hydrocarbon solvent that has one or more sidechains, the one or more sidechains containing at least 2 carbon atoms, and the aromatic ring having at least 3 hydrogen atoms; and a polymer of Formula (I):

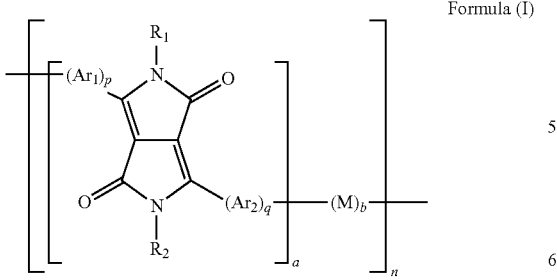
Formula (I)

wherein $R_1$ and $R_2$ are independently hydrogen, oligo(alkylene glycol), alkyl, substituted alkyl, aryl, substituted aryl, heteroaryl, or substituted heteroaryl; a is at least 1; p and q are each an integer of 0 or greater, and the sum of (p+q) is at least 2; M is a conjugated moiety; b is from 0 to about 5;

n is from 2 to about 50; and each $Ar_1$ and $Ar_2$ unit is independently selected from the group consisting of:

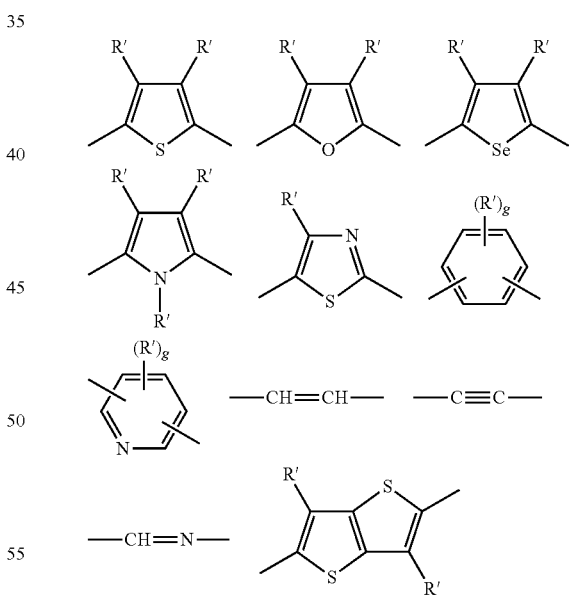

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 5.

In some embodiments, the semiconducting layer further comprises a fullerene or a fullerene derivative.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
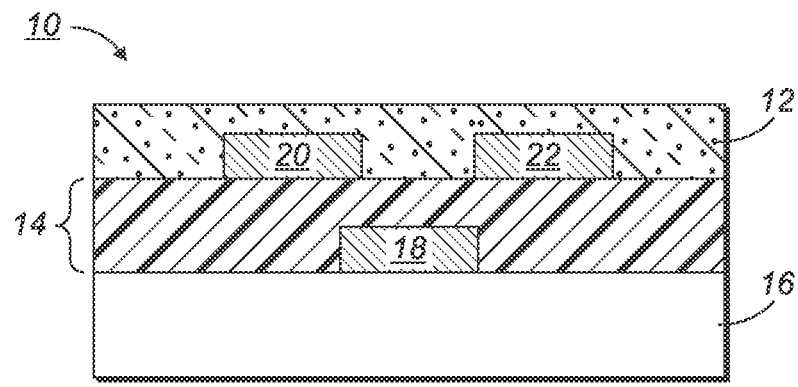
FIG. 1 is a diagram of a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range of "from about 2 to about 10" also discloses the range "from 2 to 10."

The term "comprising" is used herein as requiring the presence of the named component and allowing the presence of other components. The term "comprising" should be construed to include the term "consisting of", which allows the presence of only the named component, along with any impurities that might result from the manufacture of the named component.

The present disclosure relates to semiconductor compositions that can be used to form a semiconducting layer. A semiconducting layer formed from the composition is very stable in air and has high mobility. These semiconductor compositions are useful for forming layers in electronic devices, such as thin-film transistors (TFTs).

FIG. 1 illustrates a bottom-gate bottom-contact TFT configuration according to the present disclosure. The TFT 10 comprises a substrate 16 in contact with the gate electrode 18 and a gate dielectric layer 14. The gate electrode 18 is depicted here atop the substrate 16, but the gate electrode could also be located in a depression within the substrate. The gate dielectric layer 14 separates the gate electrode 18 from the source electrode 20, drain electrode 22, and the semiconducting layer 12. The semiconducting layer 12 runs over and between the source and drain electrodes 20 and 22. The semiconductor has a channel length between the source and drain electrodes 20 and 22.

Figure 2:
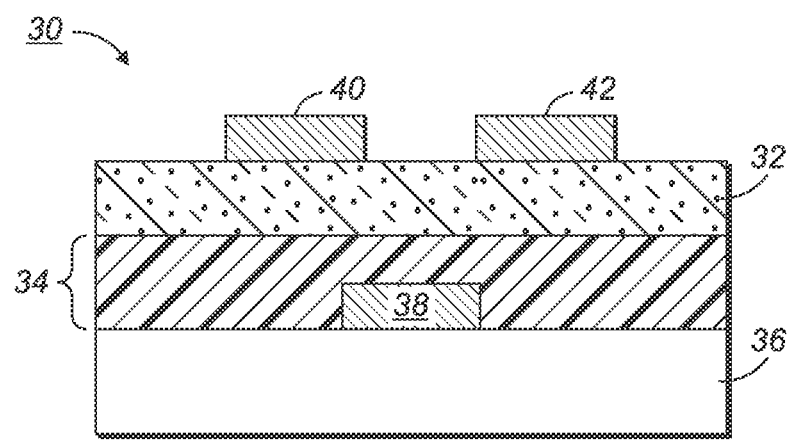
FIG. 2 is a diagram of a second embodiment of a TFT according to the present disclosure.

FIG. 2 illustrates another bottom-gate top-contact TFT configuration according to the present disclosure. The TFT 30 comprises a substrate 36 in contact with the gate electrode 38 and a gate dielectric layer 34. The semiconducting layer 32 is placed on top of the gate dielectric layer 34 and separates it from the source and drain electrodes 40 and 42.

Figure 3:
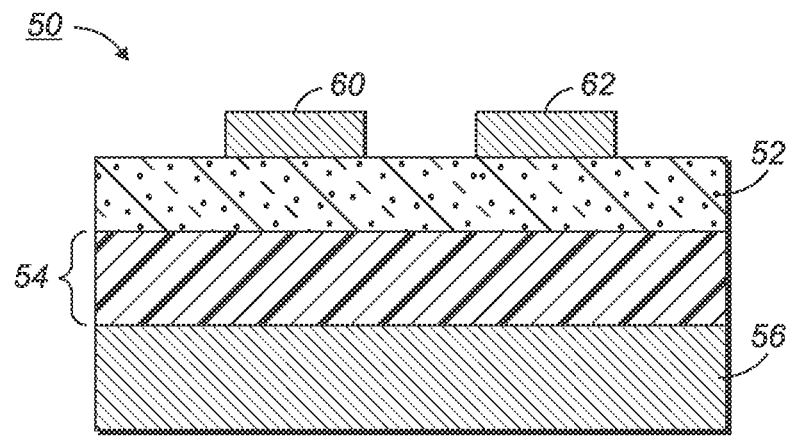
FIG. 3 is a diagram of a third embodiment of a TFT according to the present disclosure.

FIG. 3 illustrates a bottom-gate bottom-contact TFT configuration according to the present disclosure. The TFT 50 comprises a substrate 56 which also acts as the gate electrode and is in contact with a gate dielectric layer 54. The source electrode 60, drain electrode 62, and semiconducting layer 52 are located atop the gate dielectric layer 54.

Figure 4:
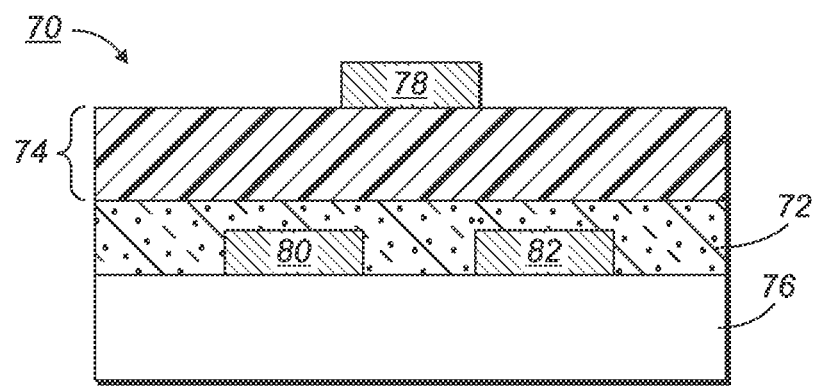
FIG. 4 is a diagram of a fourth embodiment of a TFT according to the present disclosure.

FIG. 4 illustrates a top-gate top-contact TFT configuration according to the present disclosure. The TFT 70 comprises a substrate 76 in contact with the source electrode 80, drain electrode 82, and the semiconducting layer 72. The semiconducting layer 72 runs over and between the source and drain electrodes 80 and 82. The gate dielectric layer 74 is on top of the semiconducting layer 72. The gate electrode 78 is on top of the gate dielectric layer 74 and does not contact the semiconducting layer 72.

The semiconductor compositions of the present disclosure include an aromatic non-halogenated hydrocarbon solvent; and a semiconducting polymer of Formula (I) to Formula (V) as described herein. The aromatic hydrocarbon solvent has at least one or more sidechains, and the sidechains contain at least 2 carbon atoms in total. The aromatic hydrocarbon solvent also has at least 3 hydrogen atoms attached to the aromatic ring, or in other words at least three carbon atoms in the aromatic ring are not substituted. Halogenated solvents are generally not environmentally friendly, and are not used in the compositions of the present disclosure.

The phrase "aromatic" means that the compound used as the solvent obeys Hückel's rule and has a delocalized conjugated pi system with a coplanar structure. The term "non-halogenated" means that the compound does not contain any halogen atoms at all, i.e. none are attached to the aromatic ring or to any of the sidechains. Halogen atoms are fluorine, chlorine, bromine, and iodine. The term "hydrocarbon" means that the compound contains only carbon atoms and hydrogen atoms.

As stated, the aromatic hydrocarbon solvent has at least one or more sidechains, with the sidechains containing at least 2 carbon atoms in total. The aromatic hydrocarbon solvent also has at least 3 hydrogen atoms attached to the aromatic ring, or in other words at least three carbon atoms in the aromatic ring are not substituted. Thus, for example, toluene ($C_6H_5$—$CH_3$) does not fall within the scope of the recited aromatic non-halogenated hydrocarbon solvent because it contains a total of only one carbon atom in the sidechain. Similarly, hexamethylbenzene, $C_6((CH_3)_6)$, does not fall within the scope of the recited aromatic non-halogenated hydrocarbon solvent because it does not contain three hydrogen atoms attached to the aromatic benzene ring.

In some embodiments, the aromatic non-halogenated hydrocarbon solvent contains at least 4 carbon atoms in the sidechains. It is contemplated that the sidechain can be cyclic. Thus, for example, tetrahydronaphthalene falls within the scope of the recited aromatic non-halogenated hydrocarbon solvent. In specific embodiments the aromatic non-halogenated hydrocarbon solvent contains only one phenyl ring (i.e. one benzene ring). In particular embodiments, the sidechains are alkyl. The term "alkyl" refers to a radical composed entirely of carbon atoms and hydrogen atoms which is fully saturated. The alkyl radical may be linear, branched, or cyclic.

In specific embodiments, the aromatic non-halogenated hydrocarbon solvent is selected from the group consisting of p-xylene (CAS#106-42-3), o-xylene (CAS#95-47-6), m-xylene (CAS#108-38-3), ethyl benzene (CAS#100-41-4), 1,3,5-trimethylbenzene (CAS#108-67-8), tetrahydronaphthalene (CAS#68412-24-8), and xylenes (CAS#1330-20-7). "Xylenes" refers to a mixture of the three isomers of xylene.

Of course, more than one such aromatic non-halogenated hydrocarbon solvent may also be present in the semiconductor composition if desired. In other particular embodiments, the aromatic non-halogenated hydrocarbon solvent is a substituted benzene. Desirably, the aromatic non-halogenated hydrocarbon solvent is p-xylene, o-xylene, m-xylene, ethyl benzene, tetrahydronaphthalene, or xylenes.

The aromatic non-halogenated hydrocarbon solvent should be able to dissolve the semiconducting polymer. In this regard, the solubility of the solvent can be quantified using the Hildebrand solubility parameter and the Hansen solubility parameters, which estimate the degree of interaction. The Hildebrand solubility parameter ($\delta$) is the square root of the cohesive energy density, and has the unit of $Pa^{1/2}$. The Hansen solubility parameters describe the solvent in terms of a dispersion force component ($\delta_D$), a polar component ($\delta_P$), and a hydrogen bonding component ($\delta_H$). These two parameters are related to each other by the following equation:

$$\delta^2 = \delta_D^2 + \delta_P^2 + \delta_H^2$$

Table 1 lists several different solvents and their Hildebrand solubility parameter, Hansen solubility parameters, and boiling points. Several of these solvents are not claimed, and are only provided for reference. The components are shown in units of $MPa^{1/2}$.

TABLE 1

| Solvent | Aromatic? | Total # carbon atoms | # carbon atoms in sidechain | $\delta_D$ | $\delta_P$ | $\delta_H$ | $\delta$ | bp. (° C.) |
|---|---|---|---|---|---|---|---|---|
| Benzene | Y | 6 | 0 | 18.4 | 0.0 | 2.0 | 18.5 | 80.1 |
| toluene | Y | 7 | 1 | 18.0 | 1.4 | 2.0 | 18.2 | 110.6 |
| p-xylene | Y | 7 | 2 | 17.6 | 1.0 | 3.1 | 17.9 | 138 |
| ethyl benzene | Y | 8 | 2 | 17.8 | 0.6 | 1.4 | 17.9 | 136 |
| o-xylene | Y | 8 | 2 | 17.8 | 1.0 | 3.1 | 18.1 | 144 |
| styrene | Y | 8 | 2 | 18.6 | 1.0 | 4.1 | 19.1 | 145 |
| 1,3,5-trimethyl benzene | Y | 9 | 3 | 18.0 | 0.0 | 0.6 | 18.0 | 164.7 |
| naphthalene | Y | 10 | 0 | 19.2 | 2.0 | 5.9 | 20.2 | 218 |
| n-butyl benzene | Y | 10 | 4 | 17.4 | 0.1 | 1.1 | 17.4 | 183 |
| 1,2-diethyl benzene | Y | 10 | 4 | 17.7 | 0.1 | 1.0 | 17.7 | 183 |
| Tetrahydro naphthalene (tetralin) | Y | 10 | 4 | 19.6 | 2.0 | 2.9 | 19.9 | 206-208 |
| 3-n-butyl toluene | Y | 11 | 5 | 17.4 | 0.1 | 1.0 | 17.4 | |
| p-n-butyl toluene | Y | 11 | 5 | 17.4 | 0.1 | 1.0 | 17.4 | |
| o-n-butyl toluene | Y | 11 | 5 | 17.6 | 0.1 | 1.0 | 17.6 | |
| biphenyl | Y | 12 | 0 | 21.4 | 1.0 | 2.0 | 21.5 | 255 |
| Trichloro ethylene | N | 2 | 0 | 18.0 | 3.1 | 5.3 | 19.0 | 87.2 |
| 1,1,2-trichloro ethane | N | 2 | 0 | 18.2 | 5.3 | 6.8 | 20.1 | 110-115 |
| 1,1,2,2-tetrachloro ethane | N | 2 | 0 | 18.8 | 5.1 | 9.4 | 21.6 | 146.5 |
| n-butane | N | 4 | 0 | 14.1 | 0.0 | 0.0 | 14.1 | −0.5 |
| pentane | N | 5 | 0 | 15.6 | 0.0 | 0.0 | 15.6 | 36 |
| hexane | N | 6 | 0 | 14.9 | 0.0 | 0.0 | 14.9 | 68-69 |
| cyclohexane | N | 6 | 0 | 16.8 | 0.0 | 0.2 | 16.8 | 80.7 |
| n-butyl cyclohexane | N | 10 | 4 | 16.2 | 0.0 | 0.6 | 16.2 | 178-181 |

Again, desirably the aromatic non-halogenated hydrocarbon solvent has an aromatic ring and a hydrocarbon sidechain. Without being limited by theory, it is believed that the aromatic component will solubilize the aromatic backbone portion of the polymer, and the hydrocarbon sidechain(s) will solubilize the sidechains of the polymer. These two structural features must be balanced to obtain good solubility of the polymer. In embodiments, the aromatic non-halogenated hydrocarbon solvent has a Hildebrand solubility parameter of at least 17 $MPa^{1/2}$, and in more specific embodiments, a Hildebrand solubility parameter of 17 MPa$^{1/2}$ to 20 MPa$^{1/2}$. In other embodiments, the aromatic non-halogenated hydrocarbon solvent has a boiling point of at least 70° C., including at least 100° C. or at least 140° C. Generally, the non-aromatic halogenated hydrocarbon solvent has a maximum boiling point of about 300° C. The semiconductor composition may contain a mixture of such solvents, but will not contain any halogenated solvents.

The semiconducting polymer may have the structure of Formula (I):

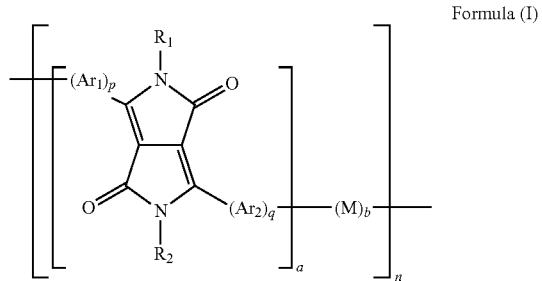

Formula (I)

wherein $R_1$ and $R_2$ are independently hydrogen, oligo(alkylene glycol), alkyl, substituted alkyl, aryl, substituted aryl, heteroaryl, or substituted heteroaryl; a is at least 1; p and q are each an integer of 0 or greater, and the sum of (p+q) is at least 2; M is a conjugated moiety; b is from 0 to about 5; n is from 2 to about 50; and each $Ar_1$ and $Ar_2$ unit is independently selected from the group consisting of:

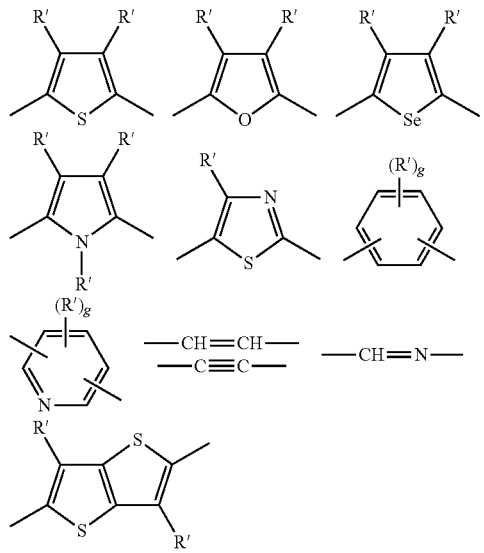

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 5.

The term "alkyl" refers to a radical composed entirely of carbon atoms and hydrogen atoms which is fully saturated. The alkyl radical may be linear, branched, or cyclic. The alkyl radical can be univalent or divalent, i.e. can bond to one or two different non-hydrogen atoms.

The term "oligo(alkylene glycol)" refers to a radical of the general formula —[(CH$_2$)$_m$O]$_n$—CH$_3$, where m and n are both integers and both are at least 1. Exemplary oligo(alkylene glycol)s include tri(ethylene glycol) monomethyl ether (m=2,n=3) and tri(propylene glycol) monomethyl ether (m=3,n=3).

The term "aryl" refers to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). The aryl radical may be univalent or divalent.

The term "heteroaryl" refers to an aromatic radical composed of carbon atoms, hydrogen atoms, and one or more heteroatoms. The carbon atoms and the heteroatoms are present in a cyclic ring or backbone of the radical. The heteroatoms are selected from O, S, and N. Exemplary heteroaryl radicals include thienyl and pyridyl.

The term "halogen" refers to fluorine, chlorine, bromine, and iodine.

The term "alkoxy" refers to an alkyl radical which is attached to an oxygen atom, i.e. —O—C$_n$H$_{2n+1}$.

The term "alkylthio" refers to an alkyl radical which is attached to a sulfur atom, i.e. —S—C$_n$H$_{2n+1}$.

The term "trialkylsilyl" refers to a radical composed of a tetravalent silicon atom having three alkyl radicals attached to the silicon atom, i.e. —Si(R)$_3$. The three alkyl radicals may be the same or different. The silicon atom attaches to the core of the compound.

The term "substituted" refers to at least one hydrogen atom on the named radical being substituted with another functional group, such as halogen, —CN, —NO$_2$, —COOH, —COOR (where R is alkyl), and —SO$_3$H. An exemplary substituted alkyl group is a perhaloalkyl group, wherein one or more hydrogen atoms in an alkyl group are replaced with halogen atoms, such as fluorine, chlorine, iodine, and bromine. Besides the aforementioned functional groups, an alkyl group may also be substituted with an aryl or heteroaryl group. An aryl or heteroaryl group may also be substituted with alkyl or alkoxy. Exemplary substituted aryl groups include methylphenyl and methoxyphenyl. Exemplary substituted heteroaryl groups include 3-methylthienyl.

Generally, the alkyl groups independently contain from 1 to 30 carbon atoms. Similarly, the aryl groups independently contain from 6 to 30 carbon atoms. The heteroaryl groups contain from 2 to 30 carbon atoms.

Specific exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, icosyl, cyclopentyl, cyclohexyl, cycloheptyl, t-butyl, isopentyl, isopropyl, 2-octyl-n-dodecyl, and isomers thereof.

Specific exemplary aryl and substituted aryl groups include phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, other aryl groups listed as exemplary M groups, and combinations thereof.

Specific exemplary heteroaryl groups include oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, and combinations thereof.

In some specific embodiments of Formula (I), $R_1$ and $R_2$ are the same. In others, $R_1$ and $R_2$ are both alkyl. In additional specific embodiments of Formula (I), b is zero. In others, the sum of (p+q) is at least 2, or is at least 4. The variable a may have a value of 1 to 5. The sum of (p+q) may be at most 20. In some embodiments, the sum of (p+q) is from 2 to 6. In still other embodiments, b may be 0 or 1.

In Formula (I), the M moiety must be different from an $Ar_1$ or $Ar_2$ unit, but can otherwise be chosen from the same moieties that $Ar_1$ and $Ar_2$ are selected from. For example, if $Ar_1$ and $Ar_2$ are unsubstituted thiophene, then M can be a substituted thiophene. The conjugated M moiety could also be a fused ring moiety, such as those illustrated below:

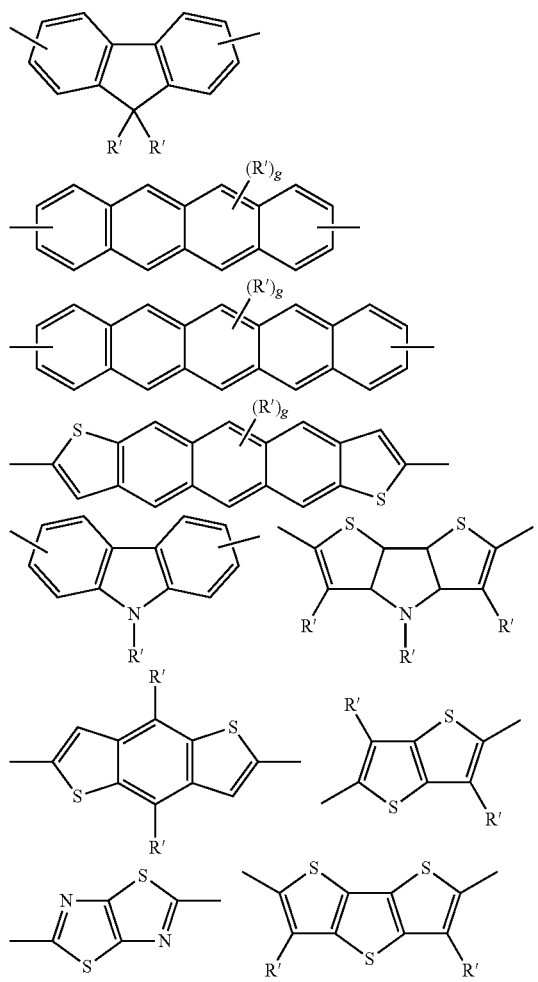

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —$NO_2$; and g is from 0 to 5.

In addition, the M moiety has a single ring structure. For example, biphenyl would be considered to be two M moieties, so M is phenyl and b=2. In particular embodiments, M is a conjugated moiety containing from about 4 to about 30 carbon atoms.

In some particular embodiments, the conjugated moiety M is selected from the following monomers:

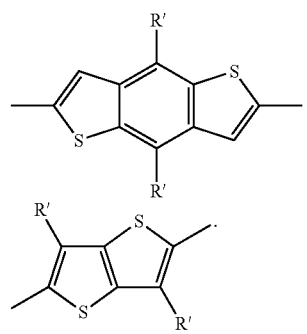

Alternatively, the semiconducting polymer may have the structure of Formula (II):

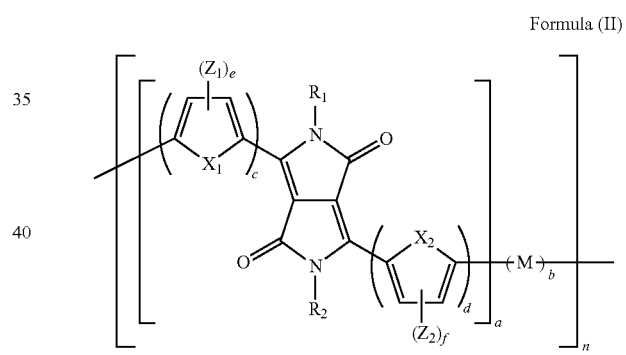

Formula (II)

wherein $R_1$ and $R_2$ are independently hydrogen, oligo(alkylene glycol), alkyl, substituted alkyl, aryl, substituted aryl, heteroaryl, or substituted heteroaryl;
each $X_1$ and $X_2$ is independently S, Se, O, or NR", wherein each R" can independently be hydrogen, aryl, or alkyl;
each $Z_1$ and $Z_2$ is independently alkyl, substituted alkyl, aryl, substituted aryl, heteroaryl, substituted heteroaryl, halogen, alkoxy, alkylthio, trialkylsilyl, —CN, or —$NO_2$;
M is a conjugated moiety;
a is at least 1; b is from 0 to about 5; c and d are each an integer of 0 or greater; the sum of (c+d) is at least 2; e and f are independently from 0 to 2; and n is from 2 to about 50.

In some specific embodiments of Formula (II), $R_1$ and $R_2$ are the same. In others, $R_1$ and $R_2$ are both alkyl. $X_1$ and $X_2$ may be the same. In others, $X_1$ and $X_2$ are S. In additional specific embodiments of Formula (II), b is zero. In others, the sum of (c+d) is at least 2, or is at least 4. The sum of (c+d) may be at most 20, and in some embodiments is from 2 to 4. In particular embodiments, $X_1$ and $X_2$ are S, b is 0, and the sum of (c+d) is at least 2. In still other embodiments, b may be 0 or 1.

It should be noted that if a moiety in the repeating unit of the polymer of Formula (II) can be construed as corresponding to a five-membered ring containing $X_1/Z_1$ or $X_2/Z_2$, it should be so construed. In this regard, the M moiety cannot be a five-membered ring that would overlap with the rings containing $X_1/Z_1$ or $X_2/Z_2$. Put another way, M is a non-thiophene conjugated moiety. In preferred embodiments, M is a conjugated moiety containing from about 4 to about 30 carbon atoms.

Alternatively, the semiconducting polymer may have the structure of Formula (III):

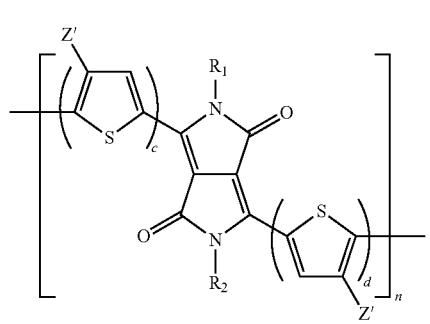

Formula (III)

wherein $R_1$ and $R_2$ are independently hydrogen, oligo(alkylene glycol), alkyl, substituted alkyl, aryl, substituted aryl, heteroaryl, or substituted heteroaryl;
each Z' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1, 2, 3, or 4.

In some specific embodiments of Formula (III), $R_1$ and $R_2$ are the same. In others, $R_1$ and $R_2$ are both alkyl. Similarly, Z' may be selected from only hydrogen and alkyl.

Alternatively, the semiconducting polymer may have the structure of Formula (IV):

Formula (IV)

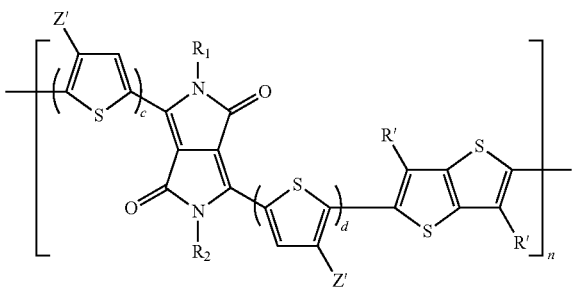

wherein $R_1$ and $R_2$ are independently hydrogen, oligo(alkylene glycol), alkyl, substituted alkyl, aryl, substituted aryl, heteroaryl, or substituted heteroaryl;
each Z' and R' is independently hydrogen, alkyl, substituted alkyl, aryl, substituted aryl, heteroaryl, substituted heteroaryl, halogen, alkoxy, alkylthio, trialkylsilyl, —CN, or —NO$_2$; and c and d are independently 1 or 2.

In some specific embodiments of Formula (IV), $R_1$ and $R_2$ are the same. In others, $R_1$ and $R_2$ are both alkyl. Similarly, Z' may be selected from only hydrogen and alkyl.

Alternatively, the semiconducting polymer may have the structure of Formula (V):

Formula (V)

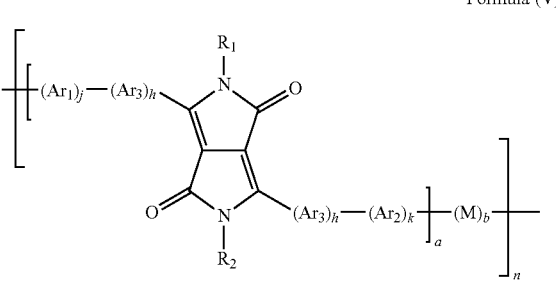

wherein $R_1$ and $R_2$ are independently hydrogen, oligo(alkylene glycol), alkyl, substituted alkyl, aryl, substituted aryl, heteroaryl, or substituted heteroaryl;
a is at least 1; h is 0 or 1; j and k are each an integer of 0 or greater; the sum of (2h+j+k) is at least 1; b is from 0 to about 5; n is from 2 to about 50;
each $Ar_1$, $Ar_2$, and $Ar_3$ unit is independently selected from the group consisting of:

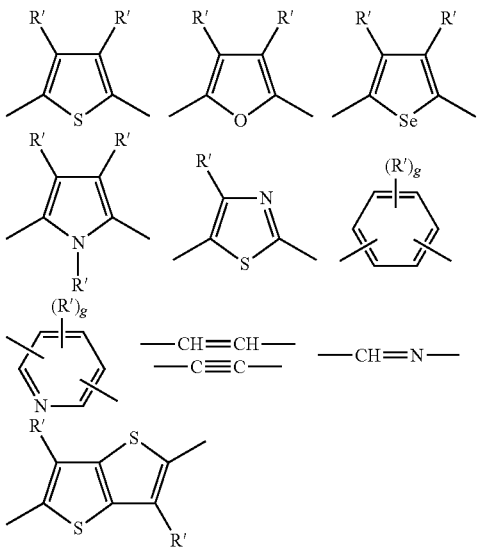

wherein each R' is independently selected from hydrogen, alkyl, substituted alkyl, aryl, substituted aryl, heteroaryl, substituted heteroaryl, halogen, alkoxy, alkylthio, trialkylsilyl, —CN, or —NO$_2$; and g is from 0 to 5; and
M is a conjugated moiety independently selected from the group consisting of:

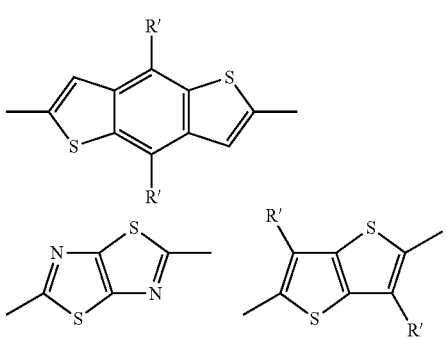

In Formula (V), the M moiety can generally be any conjugated moiety, as with Formula (I). In particular embodiments, M is a conjugated moiety containing from about 4 to about 30 carbon atoms. In some specific embodiments of Formula (V), $R_1$ and $R_2$ are the same. In others, $R_1$ and $R_2$ are both alkyl. In Formula (V), the M moiety cannot be one of the possible choices for $Ar_1$, $Ar_2$, and $Ar_3$. In some specific embodiments of Formula (VI), h=1, and j and k are both 0. In other embodiments, b=0 and h=0. In others, h=1 and b=0.

It should be noted that Formulas (II), (III), (IV), and (V) are subsets of Formula (I). Similarly, Formulas (III) and (IV) are subsets of Formula (II). The structures of Formulas (I) through (V) are generally copolymers that include a diketopyrrolopyrrole monomer or moiety. In specific embodiments, the semiconducting polymer is a copolymer comprising an optionally substituted diketopyrrolopyrrole moiety and an optionally substituted thiophene moiety. The structures of Formulas (II), (III), and (IV) are specific examples of such copolymers. Please note that the term "copolymer" is used herein as referring to a polymer containing two or more different monomers. The term "dipolymer" may be used to refer to a polymer containing only two different monomers, while the term "terpolymer" may be used to refer to a polymer containing only three different monomers.

Exemplary semiconducting polymers of these five formulas include those of Formulas (1) through (30):

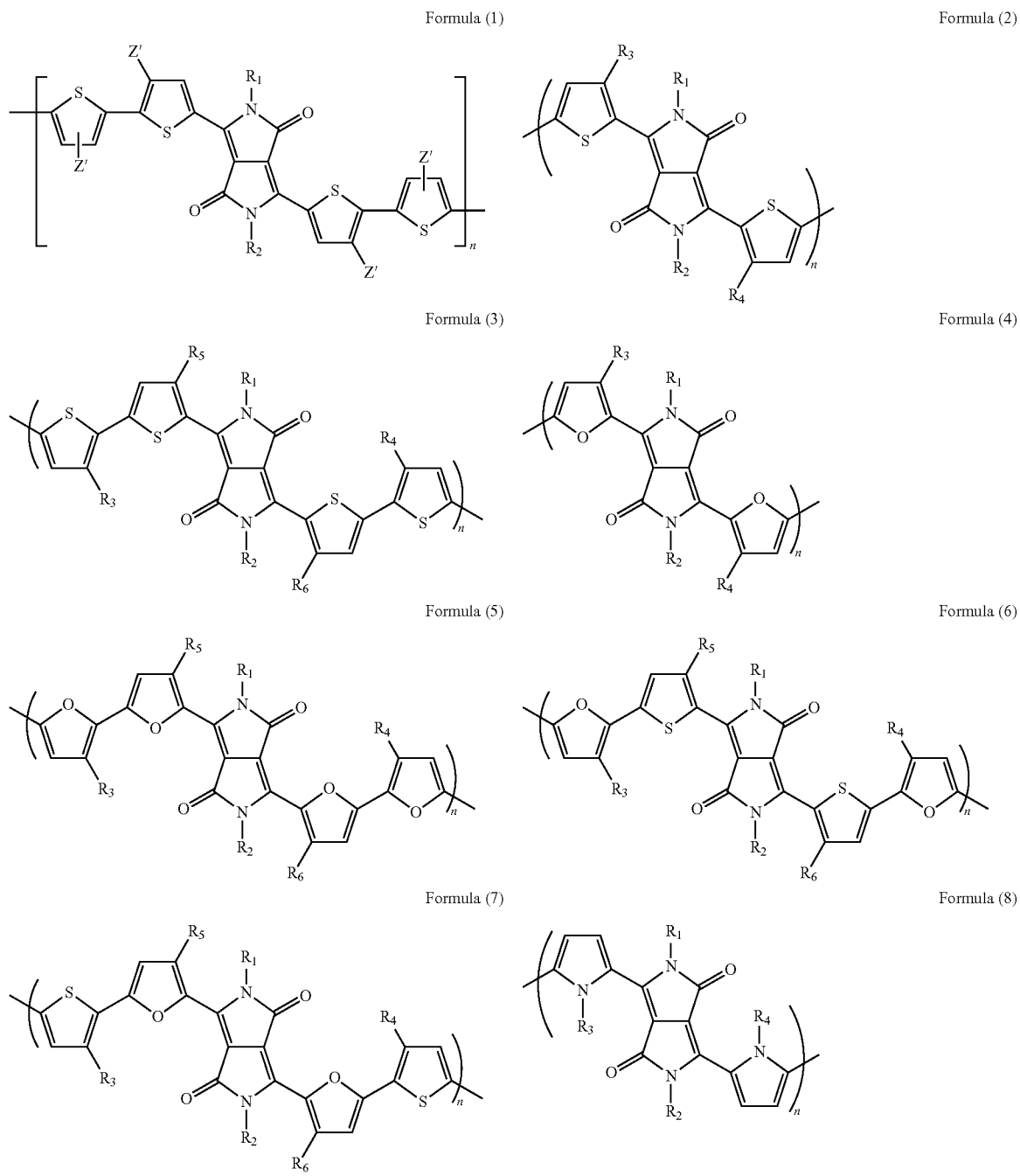

-continued
Formula (9)
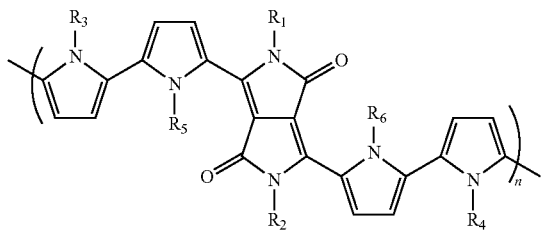
Formula (10)
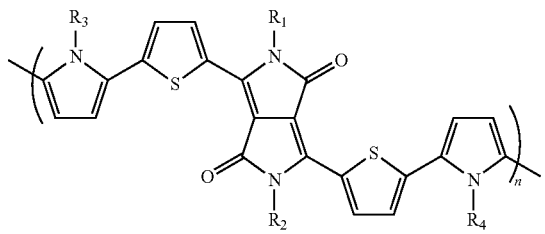
Formula (11)
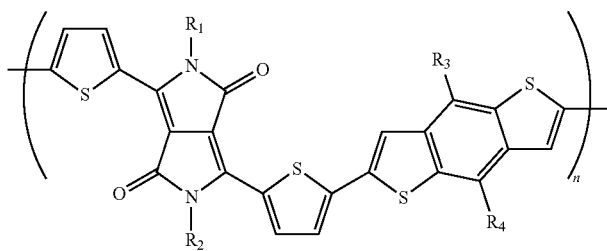
Formula (12)
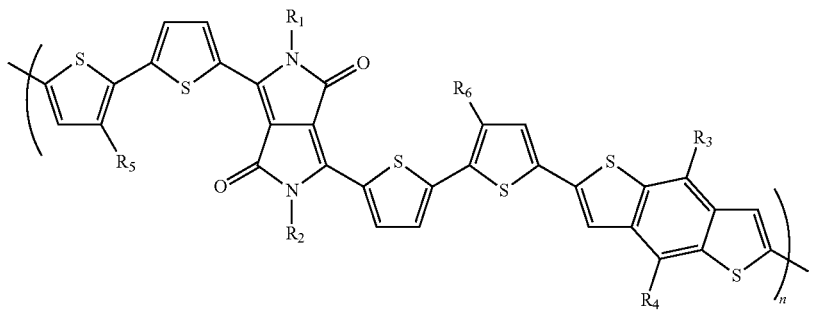
Formula (13)
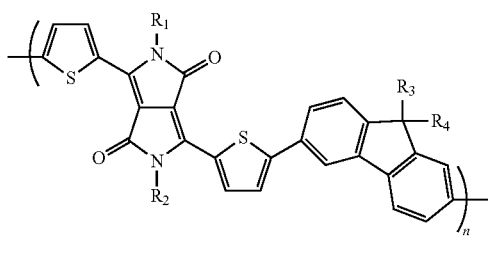
Formula (14)
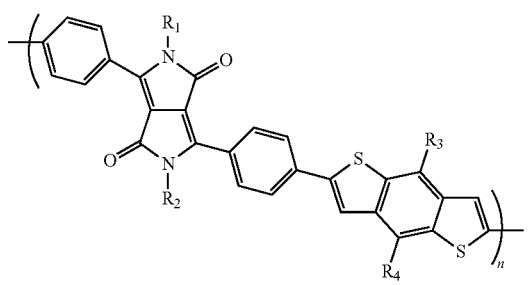
Formula (15)
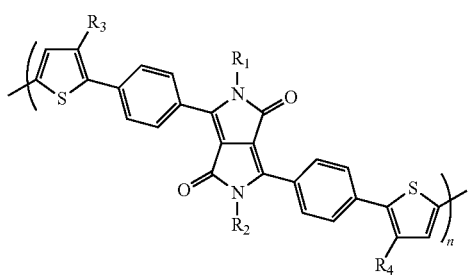
Formula (16)
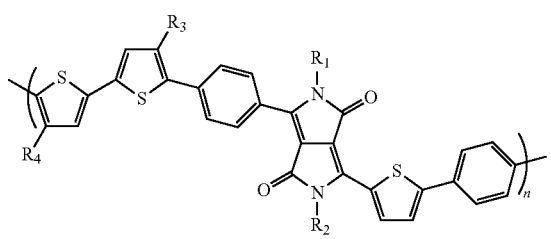

Formula (17)
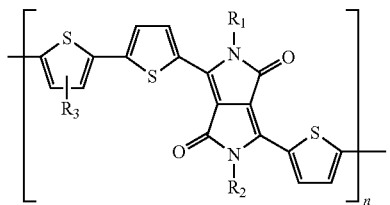
Formula (18)
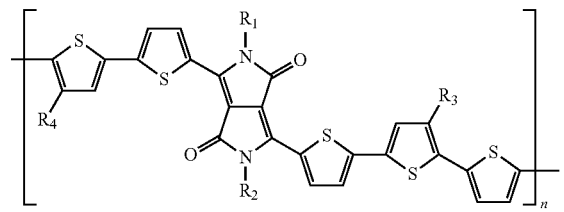
Formula (19)
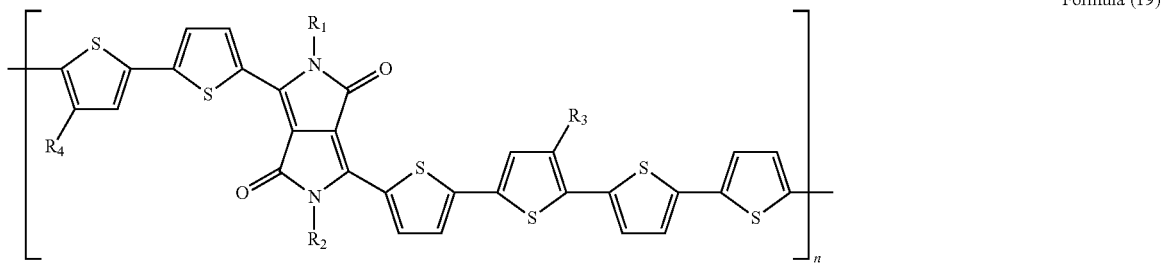
Formula (20)
Formula (21)
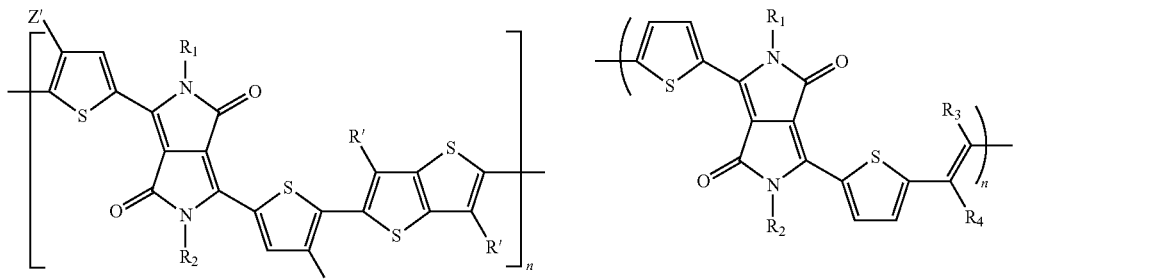
Formula (22)
Formula (23)
Formula (24)
Formula (25)
Formula (26)
Formula (27)

-continued

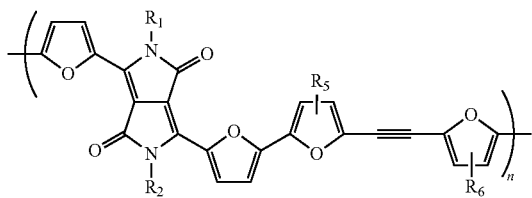

Formula (28)

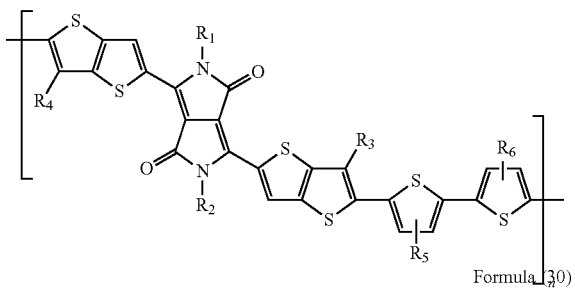

Formula (29)

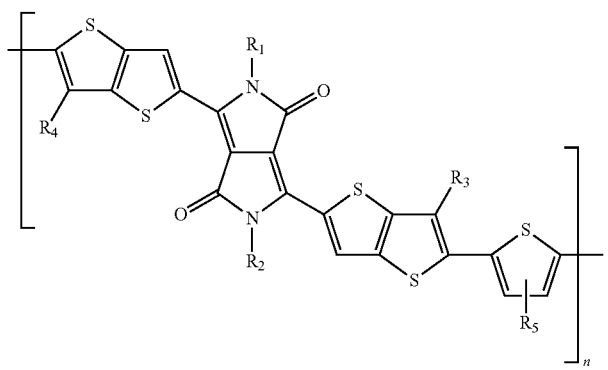

Formula (30)

wherein $R_1$ and $R_2$ are independently hydrogen, oligo(alkylene glycol), alkyl, substituted alkyl, aryl, substituted aryl, heteroaryl, or substituted heteroaryl; and each Z', R', $R_3$, $R_4$, $R_5$, and $R_6$ is independently hydrogen, alkyl, substituted alkyl, aryl, substituted aryl, heteroaryl, substituted heteroaryl, halogen, alkoxy, alkylthio, trialkylsilyl, —CN, or —NO$_2$.

Formulas (1)-(30) are specific examples of Formula (I). However, Formulas (1)-(10) and (15)-(19) and (21)-(30) allow b to be 0 or 1. In Formulas (11)-(14) and (20), b=1.

Formulas (1)-(13) and (17)-(28) are specific examples of Formula (II). Formulas (11)-(13) and (20) only fall within Formula (II) when b=1.

Formulas (1)-(3) and (17)-(19) are specific examples of Formula (III).

Formula (20) is a specific example of Formula (IV). In Formula (20), c=d=1

Formulas (1)-(30) are specific examples of Formula (V). Formulas (11)-(14) only fall within Formula (V) when b=1. In the other Formulas (1)-(10) and (15)-(30), b=0 or 1.

In some specific embodiments of Formula (I), $R_1$ and $R_2$ are alkyl. In more specific embodiments, all 1 are hydrogen, and $R_1$ and $R_2$ are alkyl.

In specific embodiments of Formulas (I)-(V) and Formulas (1)-(28), $R_1$ and $R_2$ are the same and are alkyl. In more particular embodiments, $R_1$ and $R_2$ are long-chain alkyl having from about 12 to about 30 carbon atoms.

Three specific embodiments of polymers include those of Formula (1-A), (20-A), and (20-B):

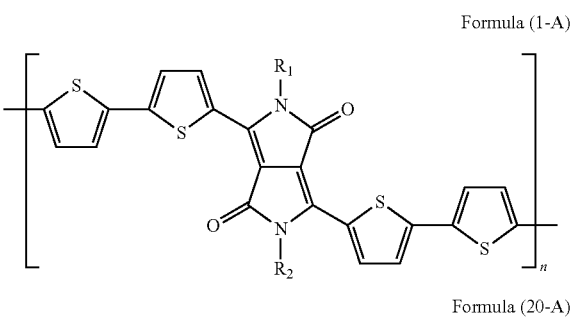

Formula (1-A)

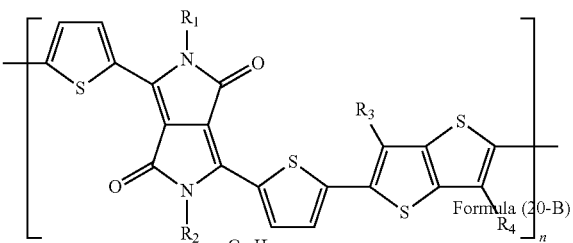

Formula (20-A)

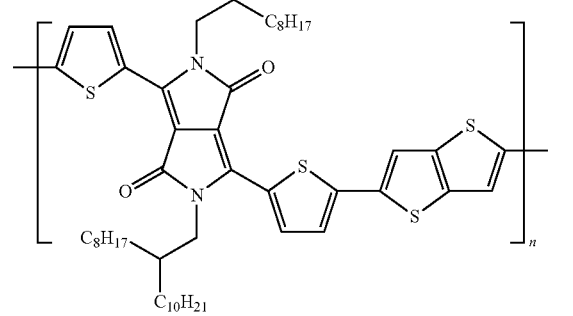

Formula (20-B)

wherein $R_1$ and $R_2$ are independently hydrogen, oligo(alkylene glycol), alkyl, substituted alkyl, aryl, substituted aryl, heteroaryl, or substituted heteroaryl; d
n is from 2 to about 50; and
$R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —$NO_2$.

Formula (1-A) corresponds to Formula (1) when the four Z' units are hydrogen. Similarly, Formula (20-A) and (20-B) correspond to Formula (20) when the two Z' units are hydrogen and $R_3$ and $R_4$ correspond to R'.

In specific embodiments, the semiconducting polymer of Formulas (I)-(V) is a copolymer containing a diketopyrrolopyrrole monomer and a thiophene monomer. In more specific embodiments, the copolymer contains at least two thiophene monomers.

In embodiments, the semiconducting polymer of Formulas (I)-(V) has a band gap of from about 1.1 to about 3.2 eV, including from about 1.2 to about 2.8 eV, or from about 1.2 to about 2.0 eV. In some embodiments, the semiconducting polymer of Formulas (I)-(V) has a small band gap from about 1.0 to about 2.0 eV. This small band gap is a result of weak donor and acceptor effects of the repeating units. The diketopyrrolopyrrole unit is an electron accepting moiety, while most of the $Ar_1$ and $Ar_2$ moieties discussed above are electron donating moieties. This combination of electron donors and electron acceptors will result in a small band gap, yet the polymer has very good stability. The semiconducting polymer has a crystalline, semicrystalline, or liquid crystalline structure in the semiconductor layer. Crystallinity can be determined for example using X-ray diffraction method.

In specific embodiments, the semiconducting polymers are diketopyrrolopyrrole-thiophene copolymers, such as those of Formulas (1), (2), (3), (17), (18), or (19). In other specific embodiments, the semiconducting polymers are terpolymers, such as those of Formula (20).

Figure 5:
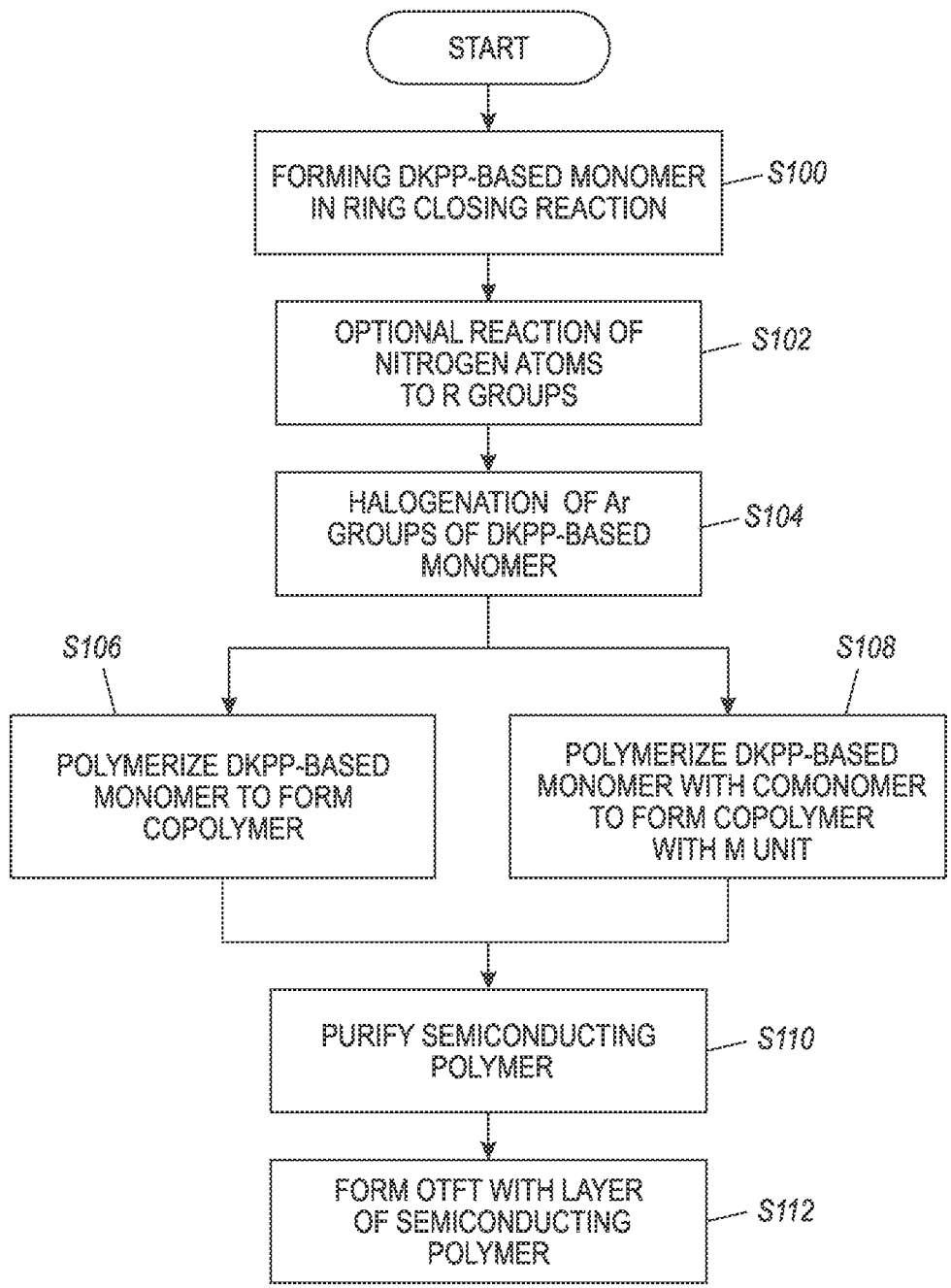
FIG. 5 is a flow chart for an exemplary method of forming a polymer layer in accordance with the disclosure.
Figure 6:
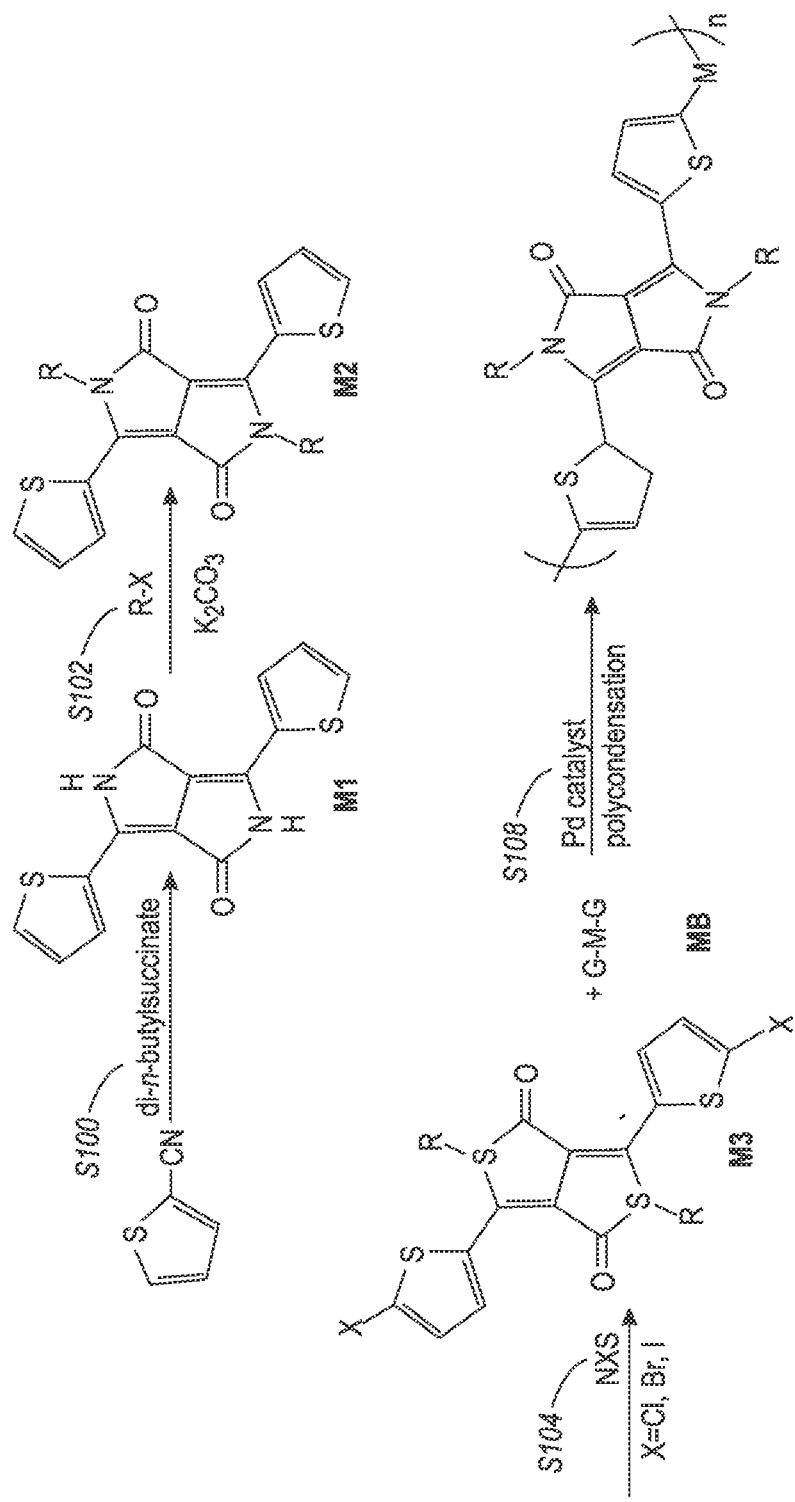
FIG. 6 is a flow chart illustrating an exemplary synthesis of a semiconducting polymer as disclosed herein.

Exemplary polymers of the present disclosure can be prepared by a five-step process, as illustrated in FIG. 5 and FIG. 6. FIG. 6 illustrates various synthesis routes for forming a copolymer of Formula (I), where $Ar_1$ and $Ar_2$ are thiophene groups. The description herein discusses the formation of diketopyrrolopyrrole (DKPP) moieties.

At step S100, a DKPP (diketopyrrolopyrrole) moiety may be formed by reacting 2 moles of an appropriate nitrile or a Schiff base with one mole of a succinic acid diester in the presence of a base and an organic solvent. For example, a carbonitrile (Ar—CN) for forming the selected Ar group (e.g., thiophenecarbonitrile) is reacted with a succinate (e.g. diisopropyl succinate or di-n-butyl succinate) under suitable conditions for ring closure of the DKPP moiety to form a monomer M1 of the general formula:

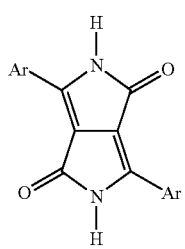

M1 where Ar is as defined above.

For example, step S100 may be carried out in solution in the presence of a sodium alkoxide, such as t-$C_5H_{11}$ONa, which may be formed in situ, followed by neutralization with an organic acid, such as glacial acetic acid. The reaction may be performed at a suitable reaction temperature, such as about 85° C.

At step S102, the H groups on the nitrogen atoms of the monomer (M1) obtained at step S100 may optionally be converted from H to a selected R group by reaction of the monomer with a halide of the formula R—Y, where R is as defined above (other than H) and Y is a halogen which may be selected from chlorine, bromine, and iodine. A monomer of the following structure (M2) is thus formed:

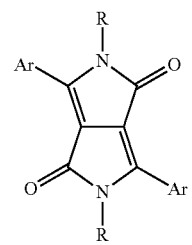

M2

When R is aryl, substituted aryl, heteroaryl, or substituted heteroaryl, an optional palladium or copper catalyst may be required.

Step S102 may be performed in solution at a suitable reaction temperature, such as about 40 to 180° C. (e.g., about 120° C.). The reaction may be carried out in a suitable solvent, such as dimethylformamide, in the presence of an appropriate base, such as an alkali metal hydroxide or carbonate and a crown ether, such as 18-crown-6. Suitable bases include NaH, NaOH, KOH, t-BuONa, t-BuOK, $Na_2CO_3$, $K_2CO_3$ and the like. Usually, the molar ratio of the base to compound M1 is chosen in the range of from 0.5:1 to 50:1. It should be noted that the alkylation step S102 is optional.

At step S104, the Ar groups are halogenated with a halogenating reagent, such as an N-halosuccinimide, to form the DKPP monomer M3:

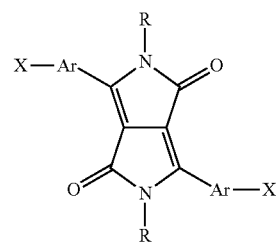

M3

X can be a halogen, such as bromine, chlorine, or iodine. Step S104 may be carried out in any suitable non-reactive medium, such as chloroform, e.g., at room temperature or above.

Continuing with step S106, the DKPP monomer (M3) can be polymerized to form a copolymer of Formula (I) or Formula (II) where no M unit is present, or in other words where b=0.

Alternatively, at step S108, the DKPP monomer (M3) is then copolymerized with a comonomer MB to form a copolymer of Formula (I) or Formula (II), wherein the comonomer provides a moiety that is different from the Ar moiety of monomer M4. This may be one way to include a different $Ar_1$ or $Ar_2$ unit into the copolymer. This may also be a way to introduce an M unit, so that b>0. Again, the M unit should be different from the $Ar_1$ and $Ar_2$ units. The exact number of b units within each polymer strand and between M3 monomers may vary, and should be considered statistically.

Step S106 or S108 may be performed in solution in the presence of a di-tin compound, such as an hexaalkyl-di-tin or hexaaryl-di-tin compound such as hexamethylditin, hexan-butylditin, or hexaphenylditin, and a catalyst suitable for coupling reactions or for polycondensation reactions, optionally in the presence of copper(I) iodide. A suitable coupling catalyst is a palladium-based catalyst, e.g., a tetrakis(triarylphosphonium)-palladium catalyst, such as tetrakis(triphenylphosphine)palladium(0) $(Pd(PPh_3)_4)$, $Pd(PPh_3)_2Cl_2$, $PdOAc_2$, $Pd(dba)_3:P(o\text{-}Tol)_3$, or derivatives thereof. Usually, the catalyst is added in a molar ratio of DKPP monomer to the catalyst in the range of from about 1000:1 to about 10:1, e.g., from about 100:1 to about 30:1. A suitable solvent for the reaction may be a mixture of THF and 1-methyl-2-pyrrolidinone (NMP). The reaction may be carried out under reflux at a temperature which is at or slightly above the boiling point of the solvent.

For example, the comonomer MB has the formula G-M-G, where M is the conjugated moiety and G is a reactive group that depends on the polycondensation reaction. For example, in a Suzuki reaction, the reactive group G may be one of those shown below:

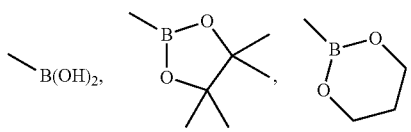

An additional base, such as $K_2CO_3$, $Cs_2CO_3$, $K_3PO_4$, KF, or CsF, is also required for a Suzuki reaction. Alternatively, in a Stille reaction, the reactive group G is a trialkylstannyl group such as $-SnMe_3$ or $-Sn(n\text{-}Bu)_3$.

At S110, the resulting polymer may be purified, e.g., by Soxhlet extraction.

At S112, a layer comprising the polymer may be incorporated into a semiconductor device.

The copolymers of Formulas (I)-(V) are soluble in the aromatic non-halogenated hydrocarbon solvent. The resulting semiconductor composition can be used to form the semiconducting layer in an electronic device. In embodiments, the semiconductor composition may have a viscosity of from about 1.5 centipoise (cps) to about 1000 cps, including from about 2 to about 100 cps, or from about 2 to about 20 cps. The semiconductor composition should contain at least 0.3 wt % of the semiconducting polymer of Formulas (I)-(V), based on the weight of the semiconductor composition. In more specific embodiments, the semiconducting polymer of Formulas (I)-(V) is present in an amount of from about 0.3 wt % to about 4 wt %. This indicates good solubility of the polymer in the aromatic non-halogenated hydrocarbon solvent.

The copolymers thus formed may have a weight average molecular weight $M_w$ in the range of from about 20,000 to about 80,000. In some embodiments, the copolymer of Formulas (I)-(V) has a $M_w$ of about 20,000 to about 60,000, including from about 35,000 to about 60,000 or from about 35,000 to about 50,000. These more desirable molecular weights correspond to a degree of polymerization of about 10 to about 30. In this regard, it has been found that the semiconducting polymers described herein are only soluble in the aromatic non-halogenated hydrocarbon solvent at suitable concentrations and give suitable performance when the $M_w$ of the polymer is within these critical ranges. When the molecular weight of the polymer is too low, the polymer has poor semiconducting performance (i.e. mobility and on/off ratio). When the molecular weight of the polymer is too high, the polymer is insoluble at suitable concentration in the aromatic non-halogenated hydrocarbon solvent.

The semiconductor compositions of the present disclosure can be used to form a semiconducting layer in an electronic device using conventional processes known in the art. In embodiments, the semiconducting layer is formed using solution depositing techniques. Exemplary solution depositing techniques include spin coating, blade coating, rod coating, dip coating, screen printing, ink jet printing, stamping, stencil printing, screen printing, gravure printing, flexography printing, and the like.

The semiconductor compositions of the present disclosure can be useful in forming the semiconducting layer of various electronic devices, for example, thin film transistors, photovoltaic, light emitting diodes, light emitting transistors, sensors, and the like.

It is also contemplated that the semiconducting layer can further comprise a fullerene or a fullerene derivative. The fullerene/fullerene derivative can be included in the semiconducting composition. The term "fullerene" refers to a polyhedral closed cage made up entirely of n three-coordinate carbon atoms and having 12 pentagonal faces and (n12-10) hexagonal faces, where n≥20. Examples of fullerenes include C60, C70, C76, C78, C82, and C84. The term "fullerene derivative" refers to a fullerene that is modified by the addition of addends at a broken double bond. The addend can be any appropriate ligand. An example of a fullerene derivative is Phenyl-C61-butyric acid methyl ester (PCBM). Illustrated below are C60 and PCBM.

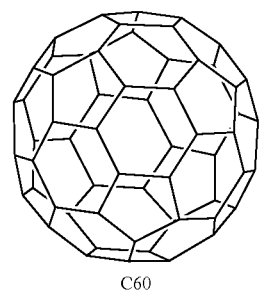

C60

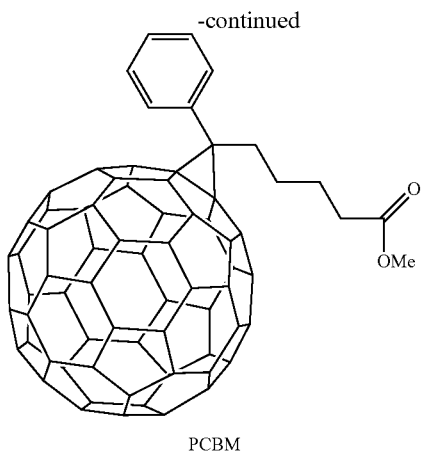

PCBM

The semiconducting layer formed using the semiconductor composition can be from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The performance of a TFT can be measured by mobility. The mobility is measured in units of $cm^2/V \cdot sec$; higher mobility is desired. The resulting TFT using the semiconductor composition of the present disclosure may have a field effect mobility of at least 0.4 $cm^2/V \cdot sec$, or at least 0.5 $cm^2/V \cdot sec$. The TFT of the present disclosure may have a current on/off ratio of at least $10^3$.

A thin film transistor generally includes a substrate, an optional gate electrode, source electrode, drain electrode, and a dielectric layer in addition to the semiconducting layer.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

In the present disclosure, the dielectric layer may be surface modified with a surface modifier. Exemplary surface modifiers include organosilanes such as hexamethyldisilazane (HMDS), octyltrichlorosilane (OTS-8), octadecyltrichlorosilane (ODTS-18), and phenyltrichlorosilane (PTS). The semiconducting layer can be directly contacted with this modified dielectric layer surface. The contact may be complete or partial. This surface modification can also be considered as forming an interfacial layer between the dielectric layer and the semiconducting layer.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer. The resulting TFT has good mobility and good current on/off ratio.

The following examples are for purposes of further illustrating the present disclosure. The examples are merely illustrative and are not intended to limit the present disclosure to the materials, conditions, or process parameters set forth therein.

EXAMPLES

Synthesis of Monomer

Poly(2,5-dioctadecyl-3,6-bis(thienyl-5-yl)-diketopyrrolopyrrole was synthesized as outlined in Scheme 1 below. This copolymer falls within Formula (I), Formula (II), Formula (III), Formula (V), and Formula (2) where $R_1=R_2=C_{18}H_{37}$, and $R_3=R_4=H$.

Scheme 1. Synthesis of polymer 4.

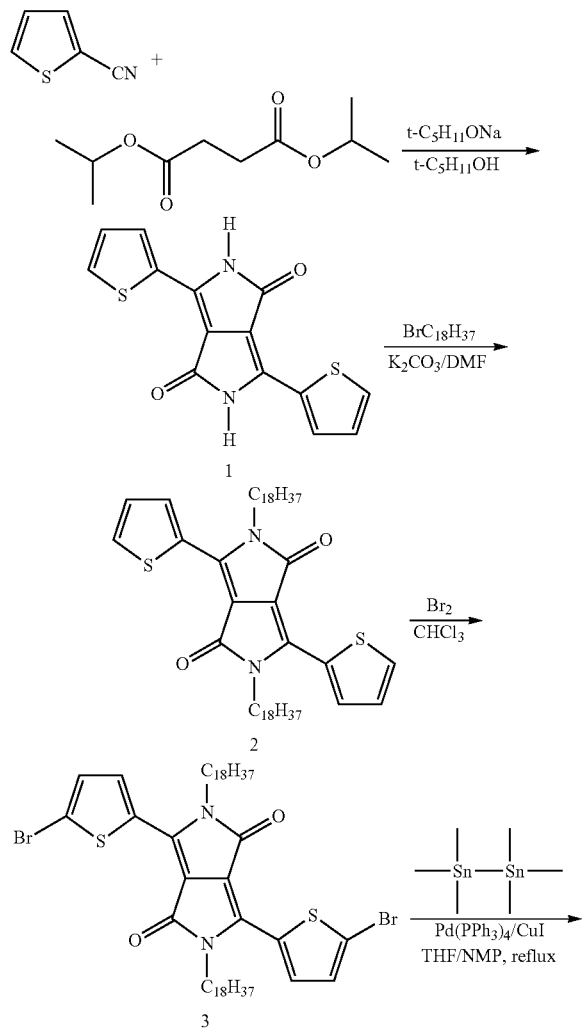

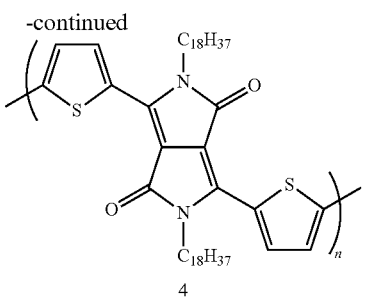

Synthesis of 3,6-Bis-(thienyl)-diketopyrrolopyrrole (1)

Sodium (3.45 grams, 0.15 mol) was added to 60 mL of t-amyl alcohol and a small amount of iron(III) chloride (50 mg) was added. The mixture was stirred vigorously for 1 hour at 95-102° C. until the sodium disappeared. The solution was cooled to 85° C. To the resultant solution was added 10.9 grams (0.1 mol) of 2-thiophenecarbonitrile. Then, 8.3 grams (0.04 mol) of diisopropyl succinate in 5 mL of t-amyl alcohol was added drop-wise over 1 hour at 85° C. When addition was complete, the mixture was maintained for 2 hours at this temperature. The reaction mixture was then cooled to 50° C., diluted with 50 mL of methanol, and then slowly neutralized with ~15 mL of glacial acetic acid and refluxed briefly, and the reaction mixture was filtered. After the residue was washed several times with hot methanol and water, the resultant solid was dried in vacuo at 50° C. A bluish-red solid (11 grams, yield 92%) was obtained (compound (1)). The solid was analyzed with NMR, with the results being as follows: 1H NMR (DMSO-D6): 11.23 (s, 2H), 8.20 (d, J=3.7 Hz, 2H), 7.95 (d, J=4.9, 2H), 7.29 (dd, J1=3.7 Hz, J2=4.9 Hz, 2H).

2,5-Dioctadecyl-3,6-bis-(thienyl)-diketopyrrolopyrrole (2)

A mixture of compound (1) (1.5 grams, 5 mmol), 2.31 grams (16.7 mmol) of $K_2CO_3$, 12 mg of 18-crown-6, and 1-bromooctadecane (5.57 grams, 16.7 mmol) in 75 mL of dimethylformamide (DMF) was heated at 120° C. overnight. After being cooled to room temperature, the solution was filtered, and the solid was washed with water several times. The solid was dissolved in chloroform by heating and filtered. The filtrate was cooled to room temperature and red precipitates formed. The solid was filtered and dried in vacuo (compound (2)). Yield: 3.01 g (74.7%). 1H NMR (CDCl3): 8.93 (dd, J1=3.9 Hz, J2=1.1 Hz, 2H), 7.64 (dd, J1=5.0 Hz, J2=1.1 Hz, 2H), 7.28 (dd, J1=5.0 Hz, J2=3.9 Hz, 2H), 4.07 (t, J=7.8 Hz, 4H), 1.74 (m, 4H), 1.20-1.50 (m, 60H), 0.88 (t, J=6.6 Hz, 6H). Melting point: 124° C.

2,5-Dioctadecyl-3,6-bis-(5-bromothienyl)-diketopyrrolopyrrole) (3)

Compound (2) (4.416 grams, 3 mmol) and 30 mL of chloroform were added to a 100 mL three-necked flask equipped with a stirring bar, a condenser, and an addition funnel. Then, 0.96 grams (6 mmol) of $Br_2$ in 20 mL of chloroform was added to the flask at room temperature. The mixture was stirred at room temperature for 10 minutes and then warmed to 60° C. and stirred for an additional hour. The reaction mixture was then cooled to room temperature and filtered. The red solid was washed with Na$_2$SO$_3$ solution, water and finally washed with methanol extensively. The solid was then dissolved in chloroform by heating and then cooled down to room temperature. After filtration, a dark purple solid was obtained, which was dried in vacuo. Yield: 1.78 grams (61.6%). 1H NMR (CDCl3): 8.69 (d, J=4.2 Hz, 2H), 7.24 (d, J=4.2 Hz, 2H), 3.98 (t, J=7.7 Hz, 4H), 1.71 (m, 4H), 1.20-1.50 (m, 60H), 0.88 (t, J=6.6 Hz, 6H). Melting point: 161° C.

Poly(2,5-dioctadecyl-3,6-bis(thienyl-5-yl)-diketopyrrolopyrrole) (4)

To a 100 mL flask were added hexamethylditin (0.344 grams, 1.05 mmol), tetrakis(triphenylphosphine)palladium (0), Pd(PPh$_3$)$_4$ (58 mg, 0.05 mmol), copper(I) iodide (3.8 mg, 0.02 mmol), compound (3) (0.9631 g, 1 mmol), THF (30 mL), and 1-methyl-2-pyrrolidinone (NMP) (15 mL). The reaction mixture was heated to reflux for 48 hours and then cooled down to room temperature and poured into 200 mL of stirring acetone. The solid was filtered off, washed with methanol, and dried. The solid was then further purified by Soxhlet extraction using heptane for 48 hours, and then dissolved with chlorobenzene. Upon removal of solvent, a dark blue solid was obtained (0.50 grams, 62.5%) (compound (4)).

Synthesis of Polymer A

A diketopyrrolopyrrole-thiophene copolymer of Formula (A) (referred to hereafter as Polymer A) was synthesized:

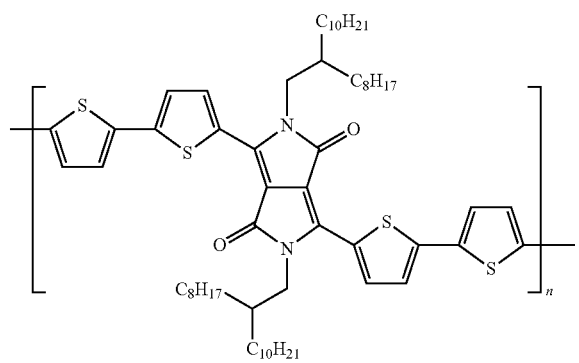

Formula (A)

In a 2-necked 100 mL round-bottomed flask 3,6-bis(5-bromothiophen-2-yl)-2,5-bis(2-octyldodecyl)pyrrolo[3,4-c]pyrrole-1,4(2H,5H)-dione (1.051 grams, 1.031 mmol) and 5,5'-bis(trimethylstannyl)-2,2'-bithiophene (0.507 grams, 1.031 mmol) were combined. The flask was fitted with a condenser and flushed with argon for 15 minutes. In a separate flask, anhydrous toluene was degassed by bubbling argon through the solvent for at least 30 minutes. The reactants were dissolved in anhydrous, deoxygenated toluene (25 mL) and the reaction was treated with Pd(PPh$_3$)$_4$ (0.060 grams, 0.052 mmol). The reaction mixture was then heated to an external temperature of 95° C. and stirred under an argon atmosphere. After 24 hours, the reaction mixture was treated with 2-bromothiophene (0.100 mL, 1.031 mmol) to end-cap the polymer chains. After 2 hours, the heating source was removed and the warm reaction mixture was poured into a mixture of deionized water (50 mL) and methanol (450 mL) to precipitate the polymer. The residual polymer was dissolved in CHCl$_3$ and added into the methanol solution. The crude polymer was collected by vacuum filtration and dried under high vacuum. The crude polymer was purified by Soxlet extraction with methanol (125 mL, 90° C., 4 hours), acetone (125 mL, 85° C., 4 hours), and hexanes (125 mL, 90° C., 18 hours) to remove any impurities and low molecular weight oligomers. The purified polymer was extracted into CHCl$_3$ (125 mL, 90° C., 4 hours) and poured into methanol (500 mL). The precipitated polymer was collected by vacuum filtration and dried under high vacuum. The polymer of Formula (A) was isolated as a dark purple solid (1.0 gram, >95%).

Comparative Example 1

12 mg of Polymer A was dissolved in 2 grams of 1,1,2,2-tetrachloroethane solvent with the assistance of heat and shaking to form a dark blue solution. The solution (0.6 wt % Polymer A) is stable at room temperature for days without precipitation.

A silicon wafer was provided as a substrate for an electronic device. Heavily doped silicon was used as a gate electrode. A 200-nm thick silicon oxide layer served as the gate dielectric layer. The surface of the silicon oxide layer was modified with octyltrichlorosilane.

After being filtered with a 0.2 micron syringe filter, the solution was spin coated at 2000 rpm onto the silicon wafer. A very smooth and shiny semiconducting film was obtained. After drying and annealing in a vacuum oven at 150° C. for 10 minutes, gold source/drain electrodes were vapor evaporated on top of the semiconducting layer to form a series of transistors. At least 10 transistors were evaluated using a Keithley SCS4200 system at ambient conditions.

Comparative Example 2

In this comparative example, chloroform was used as the solvent. The devices were fabricated using a similar procedure as described above.

Although Polymer A was readily soluble in chloroform, in some cases, no semiconductor film could be obtained upon spin coating. The chloroform solution would not remain on the octyltrichlorosilane-modified surface. In other cases, a cloudy film was obtained due to fast evaporation of the solvent. After evaporating the source/drain electrodes upon the film, the devices showed a maximum mobility of 0.42 cm$^2$/V·sec, with an average mobility of 0.28 cm$^2$/V·sec from 10 transistors.

Comparative Example 3

In this comparative example, chlorobenzene was used as the solvent. The devices were fabricated using a similar procedure as described above.

The semiconducting polymer A was soluble in chlorobenzene only at an elevated temperature. When the solution was cooled down to room temperature, precipitation was observed. After evaporating the electrodes upon the film, the devices were measured to have a maximum mobility of 0.26 cm$^2$/V·sec and an average mobility of 0.21 cm$^2$/V·sec.

Comparative Example 4

In this comparative example, 1,2-dichlorobenzene was used as the solvent. The devices were fabricated using a similar procedure as described above.

A 0.3 wt % concentration of polymer in solvent was used. However, Polymer A was only soluble in warm dichlorobenzene solvent. Once the solution was cooled down to room temperature, the polymer precipitated. After evaporating the electrodes upon the semiconductor film, the devices were measured to have a maximum mobility of 0.28 cm²/V·sec and an average mobility of 0.23 cm²/V·sec.

Comparative Example 5

In this comparative example, chlorotoluene was used as the solvent. The polymer A could not be dissolved completely in the solvent, even at 0.3 wt % concentration and at elevated temperatures.

Comparative Example 6

A diketopyrrolopyrrole-thiophene copolymer of Formula (B) (referred to hereafter as Polymer B) was synthesized in the similar manner as Polymer A:

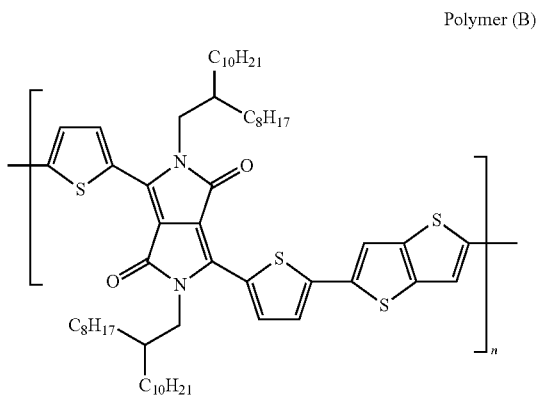

Polymer (B)

10 mg of Polymer B was dissolved in 2 grams of 1,1,2,2-tetrachloroethane solvent with the assistance of heat and shaking to form a dark blue solution. The solution (0.5 wt % Polymer B) was stable at room temperature for days without precipitation.

A silicon wafer was provided as a substrate for an electronic device. Heavily doped silicon was used as a gate electrode. A 200-nm thick silicon oxide layer served as the gate dielectric layer. The surface of the silicon oxide layer was modified with octyltrichlorosilane.

After being filtered with a 0.2 micron syringe filter, the solution was spin coated at 2000 rpm onto the silicon wafer. A very smooth and shiny semiconducting film was obtained. After drying and annealing in a vacuum oven at 150° C. for 10 minutes, gold source/drain electrodes were vapor evaporated on top of the semiconducting layer to form a series of transistors. At least 10 transistors were evaluated using a Keithley SCS4200 system at ambient conditions. The maximum mobility of the devices was calculated to be 0.66 cm²/V·sec. The transistors showed an average mobility of 0.60 cm²/V·sec.

Example 1

Polymer B ($M_n$=18 kDa) was dissolved in p-xylene at a concentration of 0.7 wt %. The solution was filtered through a 0.45 micron syringe filter, and then applied as described in Comparative Example 6.

Example 2

Polymer B ($M_n$=18 kDa) was dissolved in p-xylene at a concentration of 0.7 wt %. The solution was filtered through a 0.45 micron syringe filter, and then applied as described in Comparative Example 6, except that the surface of the silicon oxide layer was modified with octadecyltrichlorosilane (ODTS) instead.

Results

Table 2 summarizes the examples and their results.

TABLE 2

| Example | Polymer | Solvent | Avg. mobility cm²/V · sec | Max. mobility cm²/V · sec |
|---|---|---|---|---|
| Comp. Ex. 1 | A | 1,1,2,2,-tetrachloroethane | 0.65 | 0.87 |
| Comp. Ex. 2 | A | Chloroform | 0.28 | 0.42 |
| Comp. Ex. 3 | A | Chlorobenzene | 0.21 | 0.26 |
| Comp. Ex. 4 | A | 1,2-Dichlorobenzene | 0.23 | 0.28 |
| Comp. Ex. 5 | A | 1-chlorotoluene | NA | NA |
| Comp. Ex. 6 | B | 1,1,2,2,-tetrachloroethane | 0.60 | 0.66 |
| Ex. 1 | B | p-xylene | 0.60 | 0.69 |
| Ex. 2 | B | p-xylene | 0.83 | 0.91 |

Examples 1 and 2, which used p-xylene, had an average mobility about the same as that of Comp. Ex. 1 and Comp. Ex. 6, but using a non-halogenated solvent. The average mobility of Example 2 was best when ODTS was used instead of OTS to modify the surface of the dielectric layer.

Synthesis of Monomer 2,5-bis(2-octyldodecyl)-3,6-bis-(5-bromothienyl)-diketopyrrolopyrrole was synthesized as outlined in Scheme 2 below.

Scheme 2.

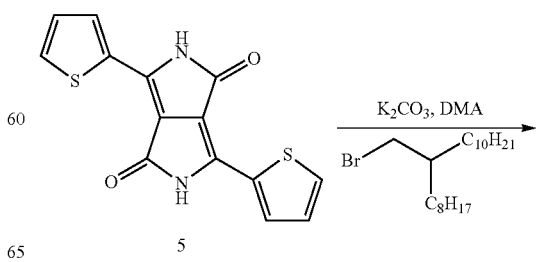

5

-continued

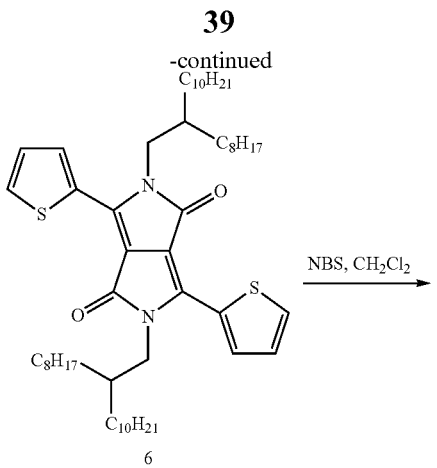

6

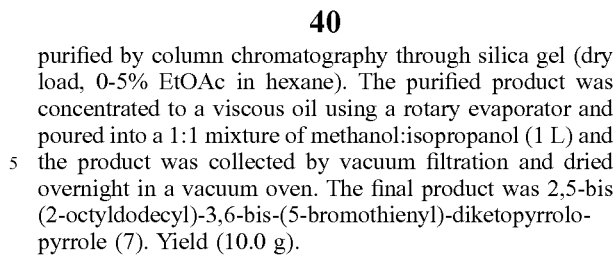

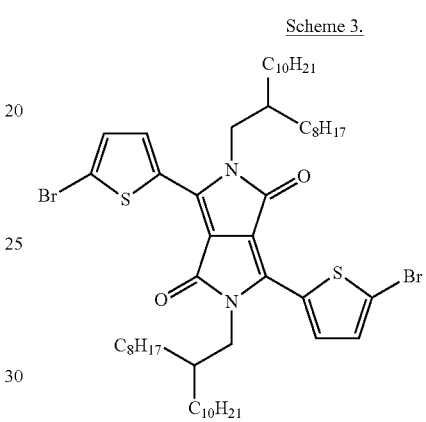

7

Synthesis of 2,5-bis(2-octyldodecyl)-3,6-bis(thienyl)-diketopyrrolopyrrole (6)

In a 500 mL round bottom flask (RBF), 3,6-bis(thienyl)-diketopyrrolopyrrole 5 (10.0 grams, 33 mmol) was dissolved in anhydrous N,N-dimethylacetamide (300 mL) and treated with potassium carbonate (13.8 grams, 100 mmol). The reaction was heated to 140° C. and stirred under an argon atmosphere for 18 hours. The heating source was removed and the reaction was cooled to room temperature and poured into a mixture of toluene (500 mL), brine (75 mL), and water (75 mL). The organic layer was separated and washed with a 1:1 mixture of water and brine (150 mL×2). The organic layer was dried (MgSO$_4$), filtered and concentrated. The purified product was concentrated to a viscous oil using a rotary evaporator and poured into a 4:1 mixture of methanol:isopropanol (1 L), and the product was collected by vacuum filtration and dried overnight in a vacuum oven. The product, 2,5-bis(2-octyldodecyl)-3,6-bis(thienyl)-diketopyrrolopyrrole (6), was used in the next reaction without further purification. Yield (24.5 g).

Next, in a 500 mL RBF, the 2,5-bis(2-octyldodecyl)-3,6-bis-(thienyl)-diketopyrrolopyrrole 6 (24.5 grams, 28 mmol) was dissolved in dichloromethane (300 mL) and cooled to 0° C. in an ice bath under an argon atmosphere. The reaction was treated portionwise with N-bromosuccinimide (9.62 grams, 54 mmol) over 30 minutes and stirred at this temperature for 3 hours. The reaction was quenched with a 1:1 mixture of saturated NaHCO$_3$ and water (150 mL). The organic layer was separated and washed with a 1:1 mixture of saturated NaHCO$_3$ and water (120 mL×2). The organic layer was dried (MgSO$_4$), filtered and concentrated to dryness using a rotary evaporator. The crude product was purified by column chromatography through silica gel (dry load, 0-5% EtOAc in hexane). The purified product was concentrated to a viscous oil using a rotary evaporator and poured into a 1:1 mixture of methanol:isopropanol (1 L) and the product was collected by vacuum filtration and dried overnight in a vacuum oven. The final product was 2,5-bis (2-octyldodecyl)-3,6-bis-(5-bromothienyl)-diketopyrrolopyrrole (7). Yield (10.0 g).

Synthesis of Polymer B

The diketopyrrolopyrrole-thienothiophene copolymer of Formula (B) (i.e. Polymer B) was synthesized by Stille polycondensation as illustrated in Scheme 3 below.

Scheme 3.

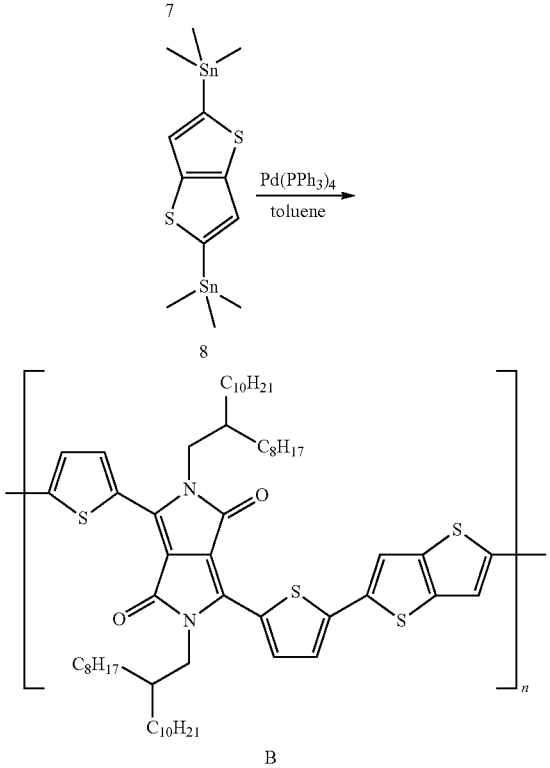

A 100 mL 2-necked RBF fitted with a condenser was charged with anhydrous toluene (30 mL) and deoxygenated by bubbling argon through the solvent for 30 minutes. The reaction vessel was placed under a positive pressure of argon and treated with 2,5-bis(2-octyldodecyl)-3,6-bis-(5-bromothienyl)-diketopyrrolopyrrole 7 (1.538 grams, 1.509 mmol), 2,5-bis(trimethylstannyl) thieno[3,2-b]thiophene 8 (0.703 grams, 1.509 mmol), and Pd(PPh$_3$)$_4$ (0.087 grams, 0.075 mmol). The reaction was then heated to an external temperature of 95° C. and stirred under an argon atmosphere for 22 hours. The polymer was end-capped with 2-bromothiophene (0.146 ml, 1.509 mmol) and stirred at this temperature for an additional 2 hours, and then the hot reaction mixture was carefully poured into a 10% aqueous methanol solution (500 mL). The crude polymer was collected by vacuum filtration and dried under high vacuum for 24 hours. The crude polymer was purified by soxlet extraction with methanol (150 mL, 95° C., 6 hours) and hexanes (150 mL, 85° C., 18 hours) to remove any impurities and low molecular weight oligomers. The crude polymer was dissolved in hot chloroform and precipitated with methanol (400 mL). The purified polymer was collected by vacuum filtration and dried under high-vacuum. The polymer molecular weight was determined using high-temperature GPC in 1,2,4-trichlorobenzene at 140° C.

The diketopyrrolopyrrole-thienothiophene copolymer of Formula (B) was also synthesized by Suzuki polycondensation as illustrated in Scheme 4 below.

Scheme 4.

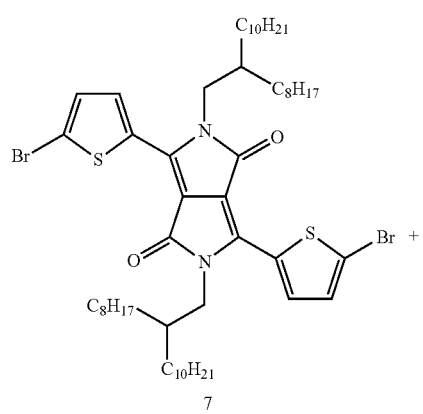

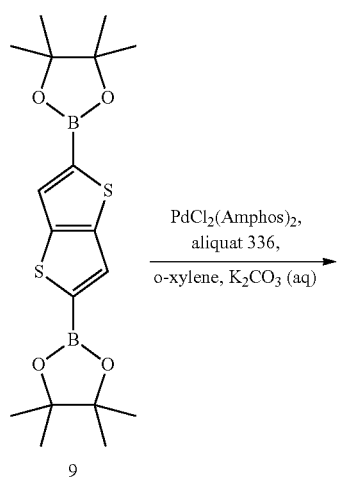

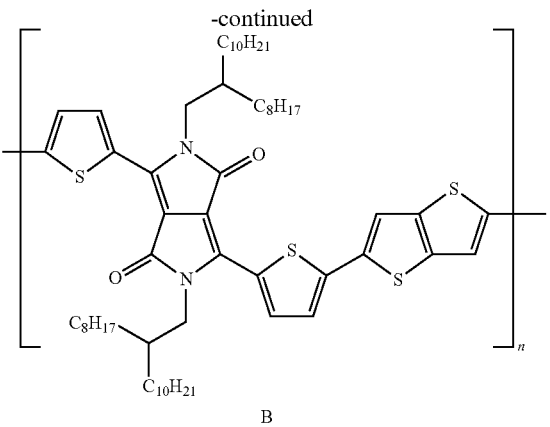

B

A 100 mL 2-necked RBF fitted with a condenser was charged with anhydrous o-xylene (24 mL), water (6 mL), and a 50% solution of ALIQUAT 336 in toluene (6 drops). The solvent mixture was deoxygenated by bubbling argon through the solvent for 30 minutes. The reaction vessel was placed under a positive pressure of argon and treated with potassium carbonate (0.678 grams, 4.91 mmol), 2,5-bis(2-octyldodecyl)-3,6-bis-(5-bromothienyl)-diketopyrrolopyrrole 7 (1.00 grams, 0.981 mmol), 2,5-bis(4,4,5,5-tetramethyl-1,3,2-dioxaborolan-2-yl)thieno[3,2-b]thiophene 9 (0.389 grams, 0.991 mmol), and PdCl$_2$(Amphos)$_2$, (0.021 grams, 0.029 mmol). The reaction was then heated to an external temperature of 90° C. and stirred under an argon atmosphere for 24 hours. The polymer was end-capped with 2-bromothiophene (0.1 ml, 0.981 mmol) and stirred at this temperature for an additional 2 hours. The reaction was quenched with a 25% aqueous ammonia solution (40 mL). The organic layers was separated and carefully poured into methanol (500 mL). The crude polymer was collected by vacuum filtration and dried under high vacuum for 24 hours. The crude polymer was purified by soxlet extraction with methanol (150 mL, 95° C., 6 hours) and hexanes (150 mL, 85° C., 18 hours) to remove any impurities and low molecular weight oligomers. The crude polymer was dissolved in hot chloroform and precipitated with methanol (400 mL). The purified polymer B was collected by vacuum filtration and dried under high-vacuum. The polymer molecular weight was determined using high-temperature GPC in 1,2,4-trichlorobenzene at 140° C.

Example 3

Polymer B was prepared by Stille polycondensation as described above. This product is labeled copolymer P1. The yield was 1.4 grams, Mn=33819, Mw=93808, PDI=2.77.

Example 4

Polymer B was prepared by Stille polycondensation as described above. This product is labeled copolymer P2. The yield was 0.92 grams, Mn=22915, Mw=57562, PDI=2.51.

Example 5

Polymer B was prepared by Suzuki polycondensation as described above. This product is labeled copolymer P3. The yield was 0.9 grams, Mn=18237, Mw=48454, PDI=2.66.

Example 6

Polymer B was prepared by Suzuki polycondensation as described above. This product is labeled copolymer P4. The yield was 0.85 grams, Mn=14613, Mw=39003, PDI=2.67.

Example 7

Polymer B was prepared by Suzuki polycondensation as described above. This product is labeled copolymer P5. The yield was 0.87 grams, Mn=16674, Mw=43673, PDI=2.62.

Example 8

Polymer B was prepared by Suzuki polycondensation as described above. This product is labeled copolymer P6. The yield was 0.70 grams, Mn=10141, Mw=21533, PDI=2.12.

Estimation of Polymer Solubility

The solubility of the copolymers in non-halogenated aromatic hydrocarbon solvents were estimated using the following method. An ~7 milligram polymer sample was weighed in a screwcap vial and was dissolved in a non-halogenated aromatic hydrocarbon solvent at a target concentration to obtain a polymer solution. The polymer solution was heated at 100° C. for 15 minutes to dissolve the polymer. The vial was mixed every 2 minutes using a vortex mixer. The vial was cooled to room temperature for 1 hour and then filtered through a 0.45 micrometer (μm) PTFE syringe filter to remove any undissolved polymer. The filtered solution was analyzed by UV-Vis spectroscopy to estimate the actual polymer concentration. A 15 microliter (μL) aliquat of the polymer solution was diluted to 3 mL and the UV-visible spectrum was acquired using a Cary 5000 spectrometer.

The solubility of polymer P6 was estimated using this method at a target concentration of 0.5 wt %. As a reference, the solubility was also performed using the chlorinated solvent tetracholorethane (TCE).

Figure 7:
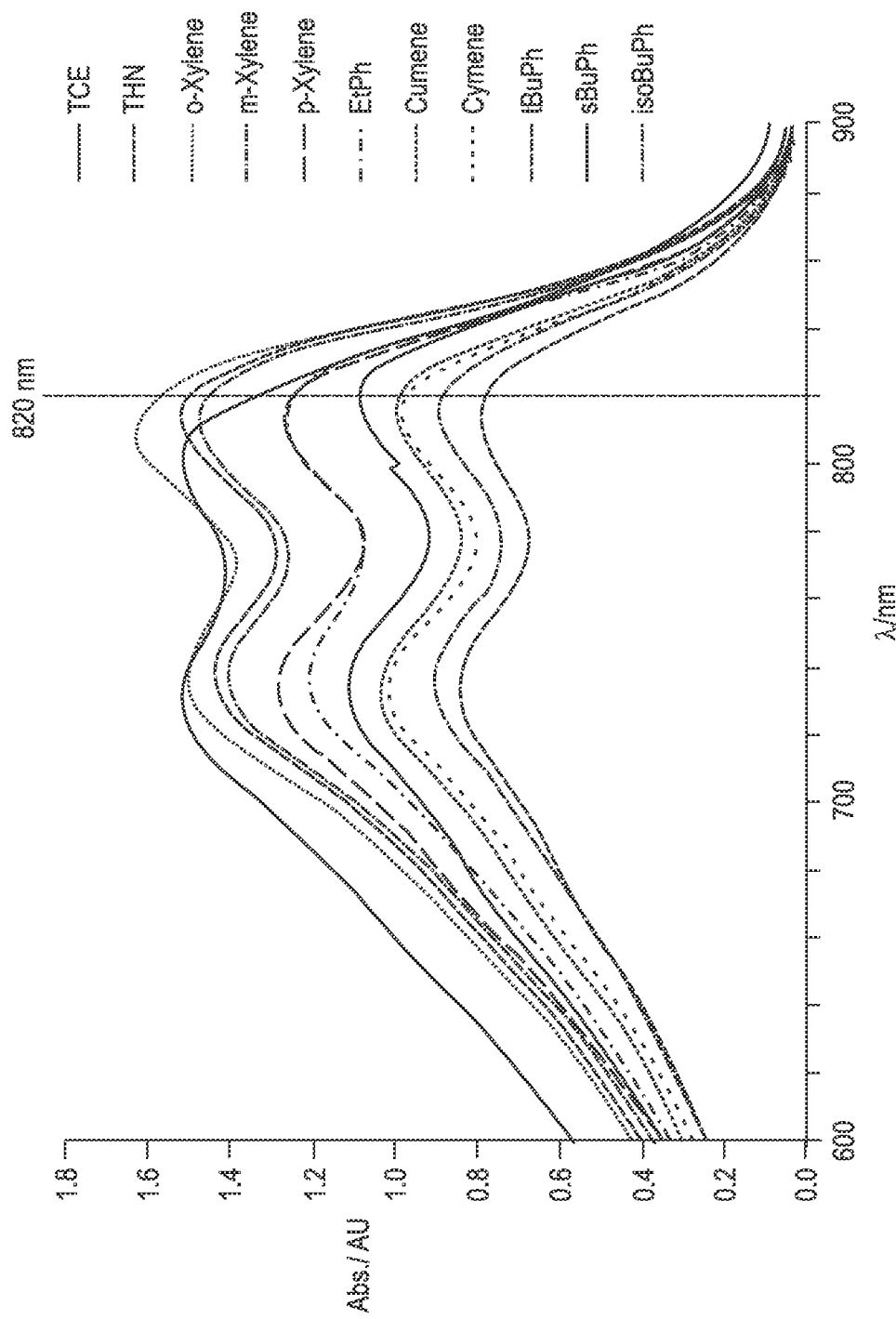
FIG. 7 is a graph showing the absorbance vs. wavelength for a polymer in different solvents, illustrating the solubility or lack thereof of the polymer in the given solvent.

The following non-halogenated aromatic hydrocarbon solvents were tested: tetrahydronaphthalene (THN), o-xylene, m-xylene, p-xylene, ethylbenzene (EtPh), cumene, cymene, t-butylbenzene (tBuPh), s-butylbenzene (sBuPh), and iso-butylbenzene (isoBuPh). The results are shown in FIG. 7.

The polymer P6 had comparable solubility to TCE (~0.5 wt.-%) in THN, o-xylene, m-xylene, p-xylene, and EtPh. The polymer had much lower solubility in cumene, cymene, tBuPh, sBuPh, and isoBuPh. Assuming the absorbance was linear to the polymer concentration, the polymer concentration for cumene, cymene, tBuPh, sBuPh, and isoBuPh was estimated to be from 0.2-0.3 wt %, which is too low for preparing polymer thin-films using spin-coating techniques. Phenyl(trimethylsilane) and valeronitrile were also evaluated as potential solvents, but were found to be poor solvents for the polymer and only negligible amounts of polymer could be dissolved (data not shown).

Figure 8:
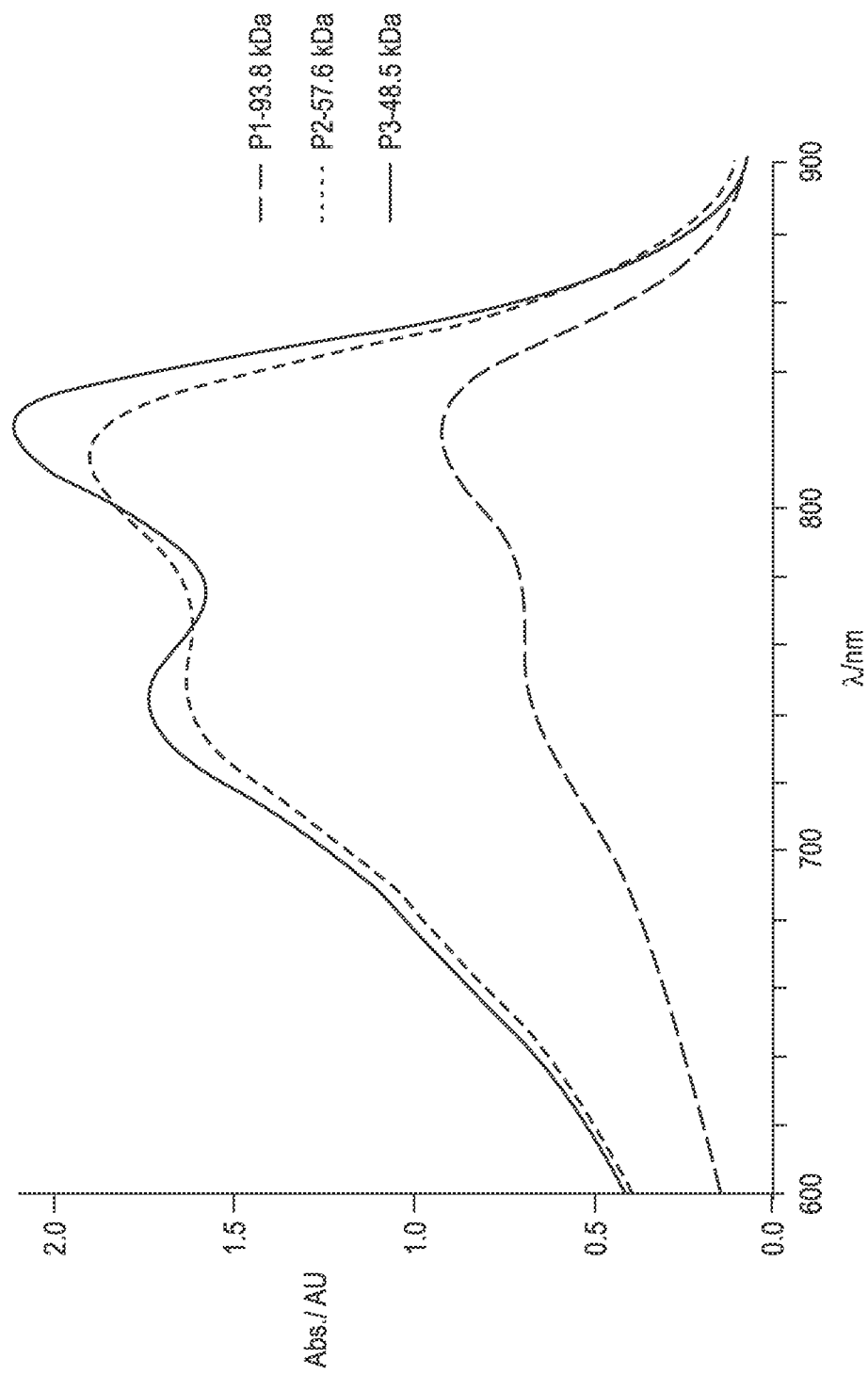
FIG. 8 is a graph showing the absorbance vs. wavelength for the same polymer at three different molecular weights in p-xylene, illustrating the importance of molecular to the solubility of the polymer.

Next, the solubility of polymers P1 (Mw=93.8 kDa), P2 (Mw=57 kDa) and P3 (Mw=48.5 kDa) were estimated using the above method at a target concentration of 0.7 wt %, to determine the effect of molecular weight on solubility. The resulting UV-Vis spectra are shown in FIG. 8. The lower molecular weight polymers P2 and P3 had a much higher absorbance than high molecular weight polymer P1, indicating that the higher molecular weight polymer had much lower solubility than the lower molecular weight polymers. KDa). In addition polymer P1 had a large amount of residual undissolved polymer, whereas polymers P2 and P3 completely dissolved. The dissolved concentration of polymer P1 was estimated to be <0.3 wt %, i.e. too low for spin-coating techniques. This illustrates the criticality of molecular weight on the ability to dissolve significant concentrations of polymer in the solvent.

Figure 9:
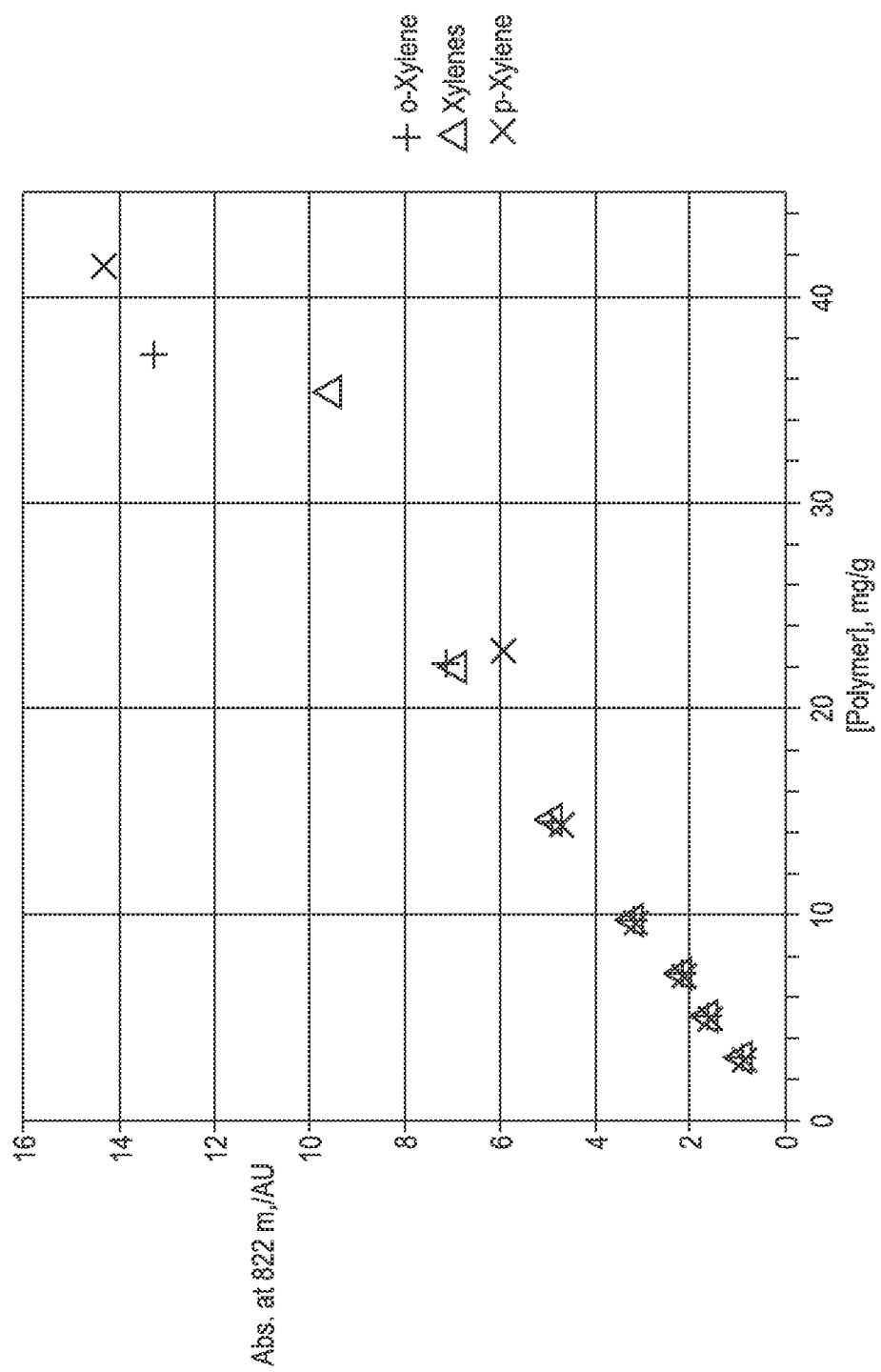
FIG. 9 is a graph showing the absorbance at 822 nm vs. the polymer concentration for three different solvents, illustrating the solubility of the polymer over the concentration range.

The same method was used to estimate the solubility of polymer P3 (Mw=48.5 kDa) in different xylene isomers. Polymer solutions at various target concentrations from 0.3-4 wt % were prepared in o-xylene, p-xylene and xylenes (mixture of isomers). In all cases, no residual undissolved polymer was observed and all solutions could be cleanly filtered through a 0.45 μm PTFE syringe filter. FIG. 9 shows the absorbance of these various solutions at the $\lambda_{max}$ (822 nm), as a function of concentration. The results give a linear response for each solvent, i.e. the polymer continued to dissolve at the same rate throughout the tested range for the given solvent. This indicates that the polymer having a Mw of less than 60 kDa has high solubility in xylene-based solvents over at least the concentration range of 0.3 wt % to 4 wt %.

Electrical Tests

Top-contact bottom gate transistors were prepared. The surfaces of silicon wafers were modified with an octadecyltrichlorosilane (ODTS) layer, and a semiconducting layer was then formed by spin-coating a 0.7 wt % polymer solution in p-Xylene at 1000 rpm for 60 seconds upon the ODTS layer. The resulting homogeneous polymer film was dried in a vacuum oven at 80° C. for 10 minutes and then annealed under vacuum at 140° C. for 10 minutes. Gold source drain-electrodes were evaporated using a shadow mask.

The mobility (μ) and on/off ratio were measured. Table 3 summarizes the results.

TABLE 3

| Polymer | $M_w$ (kDa) | Avg. mobility $cm^2/V \cdot sec$ | Max. mobility $cm^2/V \cdot sec$ | On/off |
|---|---|---|---|---|
| P3 | 48.5 | 0.83 | 0.96 | $10^6$-$10^7$ |
| P4 | 39.0 | 0.96 | 1.04 | $10^6$-$10^7$ |
| P5 | 43.7 | 0.88 | 1.01 | $10^6$-$10^7$ |

Comparing these results to those in Table 2, the non-halogenated aromatic hydrocarbon solvent achieved similar or better results for mobility.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A semiconductor composition comprising:
an aromatic non-halogenated hydrocarbon solvent selected from the group consisting of p-xylene, o-xylene, m-xylene, and tetrahydronaphthalene; and
at least 0.3 wt % of a polymer selected from the group consisting of Formula (1-A), (17), (18), (19), (20-A), and (20-B):

Formula (1-A)
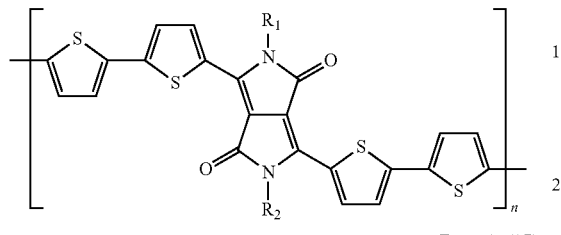

Formula (17)
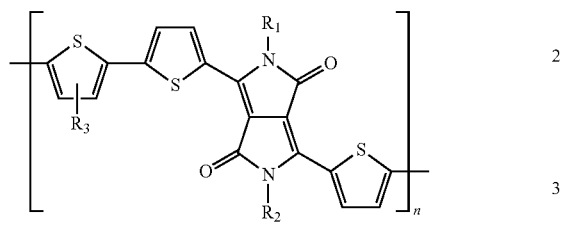

Formula (18)
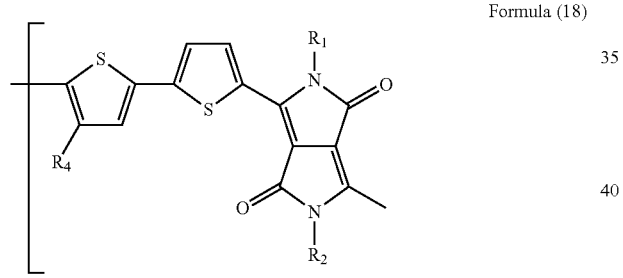

Formula (19)
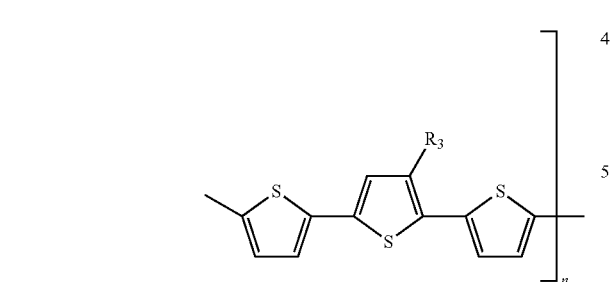

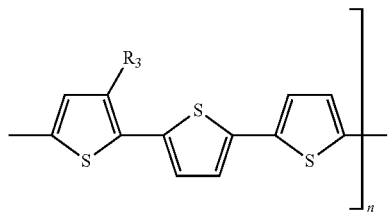

Formula (20-A)
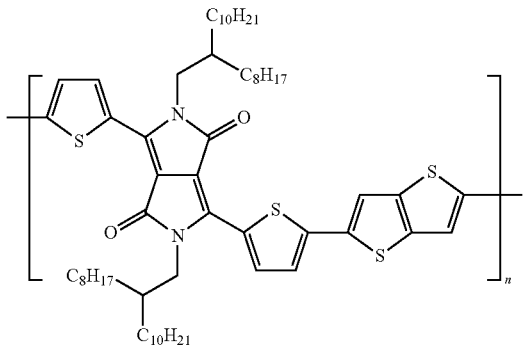

Formula (20-B)
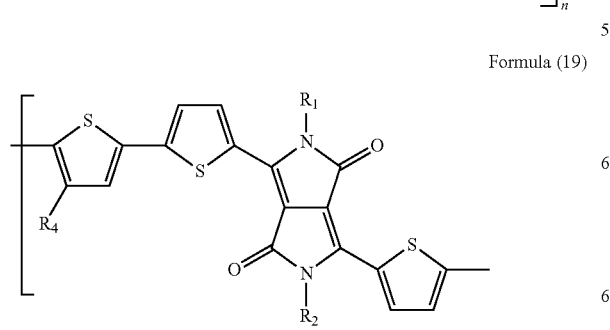

wherein $R_1$ and $R_2$ are independently hydrogen, oligo(alkylene glycol), alkyl, substituted alkyl, aryl, substituted aryl, heteroaryl, or substituted heteroaryl;

n is from 2 to about 50; and $R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$; and the polymer has a weight average molecular weight of about 20,000 to about 80,000, and the composition has a field-effect mobility of at least 0.4 cm$^2$/V·sec when formed into a semiconducting layer.

2. An electronic device comprising a semiconducting layer, wherein the semiconducting layer is formed from a semiconductor composition comprising:
an aromatic non-halogenated hydrocarbon solvent selected from the group consisting of p-xylene, o-xylene, m-xylene, and tetrahydronaphthalene; and
at least 0.3 wt % of a polymer selected from the group consisting of Formula (1-A), (17), (18), (19), (20-A), and (20-B):

Formula (1-A)

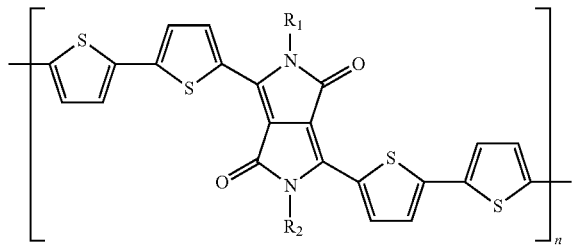

Formula (17)

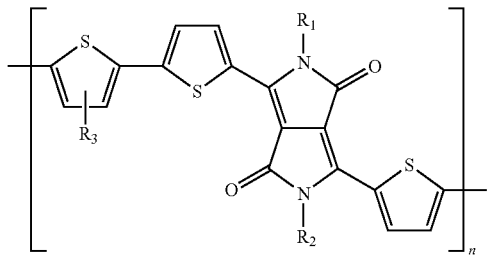

Formula (18)

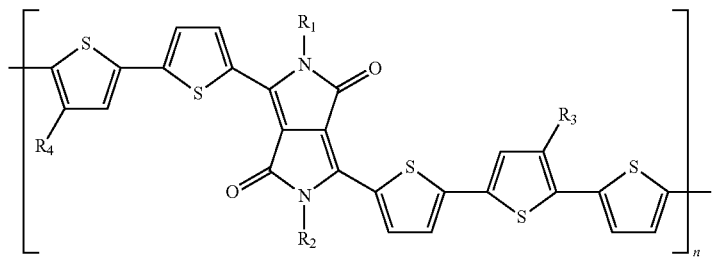

Formula (19)

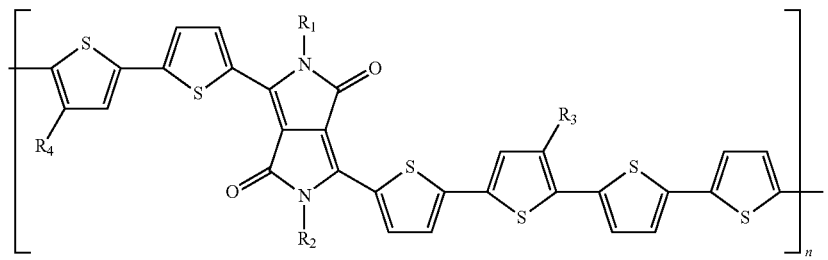

Formula (20-A)

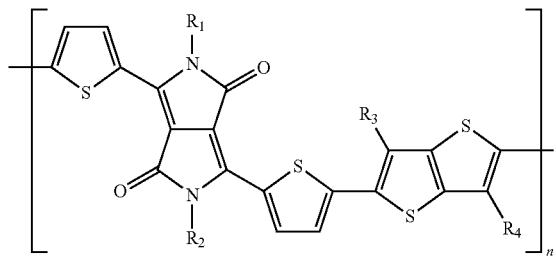

Formula (20-B)

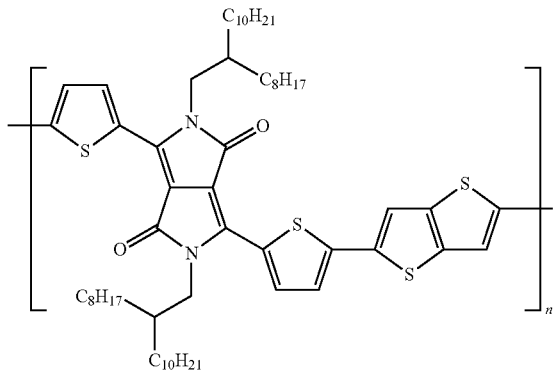

wherein $R_1$ and $R_2$ are independently hydrogen, oligo(alkylene glycol), alkyl, substituted alkyl, aryl, substituted aryl, heteroaryl, or substituted heteroaryl;

n is from 2 to about 50;

$R_3$ and $R_4$ are independently hydrogen, alkyl, substituted alkyl, aryl, substituted aryl, heteroaryl, substituted heteroaryl, halogen, alkoxy, alkylthio, trialkylsilyl, —CN, or —NO$_2$; and the polymer has a weight average molecular weight of about 20,000 to about 80,000, and the composition has a field-effect mobility of at least 0.4 cm$^2$/V·sec when formed into a semiconducting layer.

3. The electronic device of claim 2, wherein the semiconducting layer further comprises a fullerene or a fullerene derivative.

4. The electronic device of claim 2, wherein the semiconducting layer has a field-effect mobility of at least 0.5 cm$^2$/V sec.

5. The electronic device of claim 2, wherein the polymer has a weight average molecular weight of about 35,000 to about 50,000.

6. The composition of claim 1, wherein the polymer has the structure of Formula (1-A):

Formula (1-A)

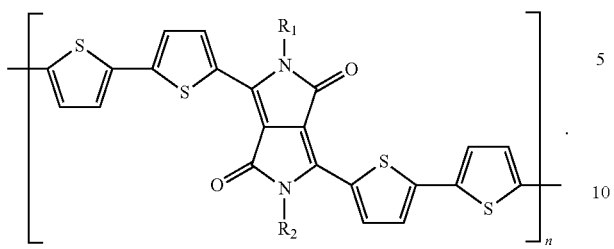

7. The composition of claim 1, wherein the polymer has the structure of Formula (17):

Formula (17)

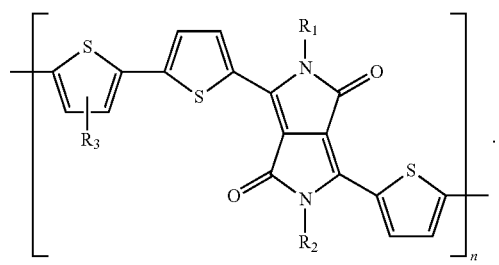

8. The composition of claim 1, wherein the polymer has the structure of Formula (18):

Formula (18)

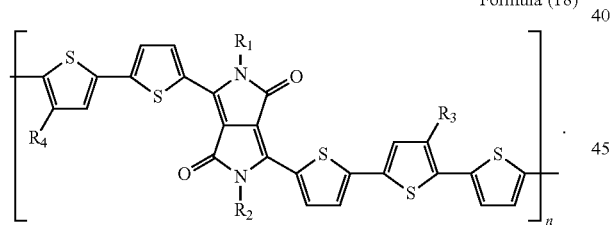

9. The composition of claim 1, wherein the polymer has the structure of Formula (19):

Formula (19)

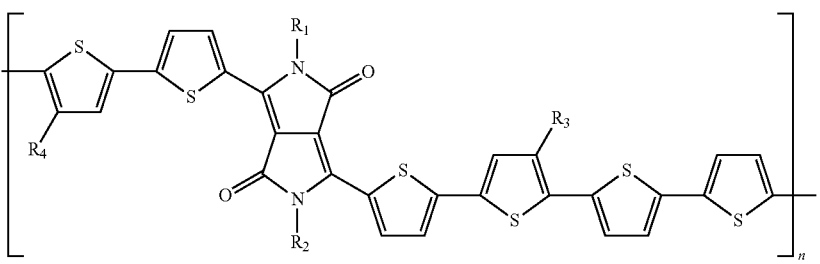

10. The composition of claim 1, wherein the polymer has the structure of Formula (20-A):

Formula (20-A)

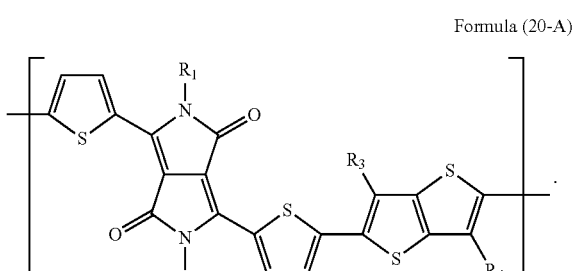

11. The composition of claim 1, wherein the polymer has the structure of Formula (20-B):

Formula (20-B)

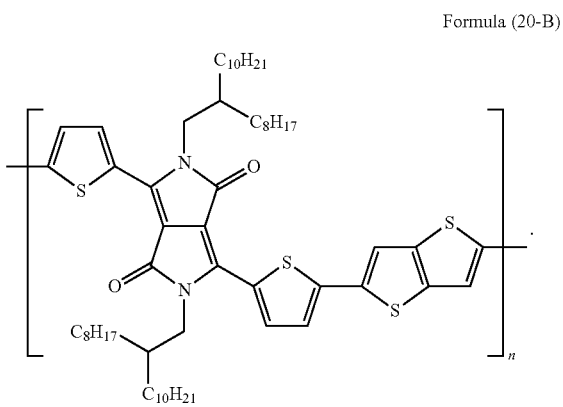

\* \* \* \* \*